United States Patent
Ishizuka et al.

(10) Patent No.: US 6,824,947 B2
(45) Date of Patent: Nov. 30, 2004

(54) PHOTOSENSITIVE COMPOSITION COMPRISING A PHENOL RESIN HAVING A UREA BOND IN THE MAIN CHAIN

(75) Inventors: Yasuhiro Ishizuka, Tatebayashi (JP); Yasuhiko Kojima, Konosu (JP)

(73) Assignee: Kodak Polychrome Graphics, LLC, Norwalk, CT (US)

( * ) Notice: Subject to any disclaimer, the term of this patent is extended or adjusted under 35 U.S.C. 154(b) by 0 days.

(21) Appl. No.: 10/370,385

(22) Filed: Feb. 19, 2003

(65) Prior Publication Data

US 2003/0224281 A1 Dec. 4, 2003

(30) Foreign Application Priority Data

Feb. 19, 2002 (JP) ........................................ 2002-042116
Jan. 16, 2003 (JP) ........................................ 2003-008326

(51) Int. Cl.[7] ........................... G03F 7/021; G03F 7/023
(52) U.S. Cl. ................. 430/157; 430/165; 430/175; 430/176; 430/189; 430/190; 430/191; 430/192; 430/193; 430/270.1; 430/281.1; 430/288.1; 430/302; 101/465; 101/466; 101/467
(58) Field of Search ................ 101/466, 467; 430/157, 165, 175, 176, 189, 190, 191, 192, 193, 270.1, 281.1, 288.1, 302, 466

(56) References Cited

U.S. PATENT DOCUMENTS

| | | | | |
|---|---|---|---|---|
| 3,072,595 A | * | 1/1963 | Barth et al. | 525/498 |
| 3,076,789 A | * | 2/1963 | Mochel et al. | 528/335 |
| 4,757,108 A | * | 7/1988 | Walisser | 524/596 |
| 5,372,907 A | | 12/1994 | Haley et al. | |
| 6,294,311 B1 | | 9/2001 | Shimazu et al. | |

FOREIGN PATENT DOCUMENTS

| | | |
|---|---|---|
| GB | 1151199 | 5/1969 |
| GB | 1154749 | 6/1969 |
| JP | 63-287943 | 11/1988 |
| JP | 63-261350 | 8/1990 |
| JP | 2-244050 | 9/1990 |
| JP | 07-020629 | 1/1995 |
| JP | 8-339080 | 12/1996 |
| JP | 8-339082 | 12/1996 |
| JP | 2000-181059 | 6/2000 |
| JP | 2000-199950 | 7/2000 |
| JP | 2000-330265 | 11/2000 |

* cited by examiner

*Primary Examiner*—John S. Chu
(74) *Attorney, Agent, or Firm*—RatnerPrestia

(57) ABSTRACT

Photosensitive compositions comprising a phenol resin having a urea bond in the main chain, planographic printing plate precursors containing the photosensitive compositions, and methods for preparing planographic printing plates using the planographic printing plate precursors are disclosed. Planographic printing plates that exhibit good durability, good exposure visual image property, and good solvent resistance; particularly superior resistance to washing oil used in UV ink printing; and superior baking property are produced.

15 Claims, No Drawings

PHOTOSENSITIVE COMPOSITION COMPRISING A PHENOL RESIN HAVING A UREA BOND IN THE MAIN CHAIN

FIELD OF THE INVENTION

The present invention relates to a photosensitive composition, a photosensitive planographic printing plate precursor, and a method for manufacturing the planographic printing plate precursor.

BACKGROUND OF THE INVENTION

A planographic printing plate used in the field of offset printing has hitherto been produced by bringing a silver salt mask film having an image previously formed thereon into close contact with a photosensitive planographic printing plate comprising a substrate and a photosensitive layer provided on the substrate, and subsequently exposing the entire surface to activating light rays, thereby to transfer the image onto the photosensitive planographic printing plate, followed by wet development, post-treatment, and drying processes.

Examples of light sources of activating light rays used in these processes include mercury lamps, metal halide lamps, xenon lamps, chemical lamps, carbon arc lamps, and the like. The photosensitive layer of the photosensitive planographic printing plate is designed to be sensitive to light having a wavelength in a range of from 300 to 450 nm corresponding to an output wavelength of these light sources.

Such photosensitive planographic printing plates include, for example, positive-working photosensitive planographic printing plates, which can be developed with a developer of an aqueous alkali solution (hereinafter referred to as an alkali developer). As positive-working photosensitive compositions used in a photosensitive layer of such a positive-working photosensitive planographic printing plates, photosensitive compositions containing an alkali-soluble resin, such as a novolac resin, and a quinone diazide compound, are known.

In addition, a negative-working photosensitive planographic printing plate, which can be developed with an aqueous alkali developer, is also known. Examples of the negative-working photosensitive compositions used in the photosensitive layer of the negative-working photosensitive planographic printing plates include photosensitive compositions containing an alkali-soluble resin and a photosensitive diazonium compound, and photosensitive compositions containing an alkali-soluble resin, an ethylenically unsaturated compound, and a radical polymerization initiator.

With the progress of computer image processing techniques, a method of directly writing an image by irradiation with light corresponding to a digital signal has recently been developed. Intense interest has been shown towards a computer-to-plate (CTP) system of directly forming an image on a photosensitive planographic printing plate without outputting to a silver salt mask film, by utilizing this system in a planographic printing plate. As a light source for irradiation with light, a laser having a maximum intensity in the ultraviolet, visible or infrared range of from 300 nm to 1200 nm, such as an Ar ion laser, a YAG laser, a He—Ne laser, or a semiconductor laser, can be used. The CTP system using a high-output laser having a maximum intensity within a near infrared or infrared range has such advantages that a high-resolution image can be obtained by exposure in a short time and a photosensitive planographic printing plate used in the system can be handled in a lighted room. In particular, high-output, small lasers are easily available as a solid laser and a semiconductor laser, which emit infrared rays having a wavelength in a range of from 760 nm to 1200 nm.

As the positive-working photosensitive composition that can form an image using the solid laser or semiconductor laser capable of emitting infrared light, a photosensitive composition comprising an alkali-soluble resin (such as a novolac resin) and a photothermal conversion material (for example, an infrared absorber such as a dye or pigment) is known.

As the negative-working photosensitive composition that can form an image using the solid laser or semiconductor laser capable of emitting infrared light, a photosensitive composition comprising an alkali-soluble resin (such as a novolac resin), an acid crosslinking agent (such as a resol resin), a compound capable of generating an acid by means of heat (for example, an acid generating agent), and a photothermal conversion material (for example, an infrared absorber such as a dye or pigment) is proposed in Japanese Unexamined Patent Application, First Publication No. Hei 7-20629.

As the negative-working photosensitive composition that can form an image using a laser that emits infrared light from visible light, such as an Ar ion laser, a YAG laser, a He—Ne laser, or a semiconductor laser, those comprising an ethylenically unsaturated compound, a sensitizing pigment having an absorption maximum in a range of from 400 to 1200 nm, and a photopolymerization initiator are proposed in Japanese Unexamined Patent Application, First Publication No. 2000-181059, and Japanese Unexamined Patent Application, First Publication No. Hei 2-244050.

Examples of the alkali-soluble resin used in the photosensitive layer of the alkali-developable photosensitive planographic printing plates include, for example, vinyl polymers having an acid group such as a carboxyl group, a phenolic hydroxyl group, a sulfonic acid group, a phosphoric acid group, a sulfonamide group, or an active imide group; a polyaddition polymer such as polyurethane; and polycondensation polymers such as polyesters, in addition to novolac resins. However, the photosensitive layer having an alkali-soluble resin had problems such as poor solvent resistance to the solvent contained in various printing chemicals (for example, washing oil, fountain solution, gum solution, plate preserver, and plate cleaner). In particular, it had a problem such that the resistance to a UV ink-washing oil used in UV ink printing was insufficient and the image portion became corroded with an organic solvent. As a result, it also had a problem such that the photosensitive layer was insufficient in terms of press-life, i.e., durability.

As the photosensitive composition having improved solvent resistance and improved durability, photosensitive compositions comprising a resin having a cyano group and a urea bond in the side chain are proposed in Japanese Unexamined Patent Application, First Publication No. Hei 8-339080. In addition, in Japanese Unexamined Patent Application, First Publication No. Hei 8-339082 and Japanese Unexamined Patent Application, First Publication No. 2000-330265, it is described that a photosensitive composition comprising a resin having a urea bond in the side chain has good solvent resistance and has good durability.

However, the photosensitive layer formed by the photosensitive composition described above is still insufficient in terms of solvent resistance and durability. In particular, a further improvement in resistance to the UV ink-washing oil used in UV ink printing had been required.

In addition, as a photosensitive composition having improved wear resistance, Japanese Unexamined Patent Application, First Publication No. Sho 63-261350 proposes a photosensitive composition comprising an alkali-soluble polyurethane resin having a sulfonylureide group and the like in the side chain, and Japanese Unexamined Patent Application, First Publication No. Sho 63-287943 proposes a photosensitive composition comprising an alkali-soluble poly(urethane-urea) resin having a carboxyl group.

Furthermore, as a photosensitive planographic printing plate having improved durability, a photosensitive planographic printing plate having a photosensitive layer formed from a cyano-group-containing resin is proposed in Japanese Unexamined Patent Application, First Publication No. 2000-199950.

However, in any one of the photosensitive compositions described above, solvent resistance and wear resistance were insufficient, and the photosensitive planographic printing plates produced using these photosensitive compositions also were not sufficiently satisfied.

In addition, a method for improving durability by subjecting a planographic printing plate obtained after a developing treatment to a heat treatment (hereinafter, referred to as a baking treatment) to cure an image part is described in, for example, GB Patent No. 1,151,199 and GB Patent No. 1,154,749. The baking treatment is generally carried out by heating a planographic printing plate for 1 to 60 minutes at 180 to 320° C.

However, in some photosensitive compositions forming a photosensitive layer, the problems such as occurrences of quality deterioration due to baking, or lack of the image parts (microlines) might occur.

See also: (1) Japanese Unexamined Patent Application, First Publication No. Hei 7-20629; (2) Japanese Unexamined Patent Application, First Publication No. 2000-181059; (3) Japanese Unexamined Patent Application, First Publication No. Hei 2-244050; (4) Japanese Unexamined Patent Application, First Publication No. Hei 8-339080; (5) Japanese Unexamined Patent Application, First Publication No. Hei 8-339082; (6) Japanese Unexamined Patent Application, First Publication No. 2000-330265; (7) Japanese Unexamined Patent Application, First Publication No. Sho 63-261350; (8) Japanese Unexamined Patent Application, First Publication No. Sho 63-287943; (9) Japanese Unexamined Patent Application, First Publication No. 2000-199950; (10) GB Patent No. 1,151,199; and (11) GB Patent No. 1,154,749.

Thus, an object of the present invention is to provide a photosensitive composition that can provide a coating film having superior solvent resistance and superior wear resistance, and to provide a photosensitive planographic printing plate that can be subjected to a baking treatment, having superior solvent resistance particularly resistance to a UV ink-washing oil used in UV ink printing, having superior durability, and exhibiting superior exposure visible image properties.

SUMMARY OF THE INVENTION

After intensive research in order to achieve the object described above, the present inventors discovered that a phenol resin having a urea bond in the main chain exhibits the effect of improving the solvent resistance and wear resistance of the coating film, thus completing the present invention.

That is, a photosensitive composition of the present invention is characterized by comprising a phenol resin having a urea bond in the main chain.

Furthermore, the phenol resin preferably a resin produced by condensation polymerization between dimethylolurea and any one monomer selected from the group consisting of phenols, bisphenols, hydroxynaphthalenes, and condensates of p-cresol/formaldehyde having a low molecular weight.

Furthermore, in the phenol resin, the phenolic hydroxyl group is preferably functionalized with an ether group, an ester group, a urethane group, or a carbonate group.

Furthermore, the phenol resin preferably has a structural unit represented by general formula (A):

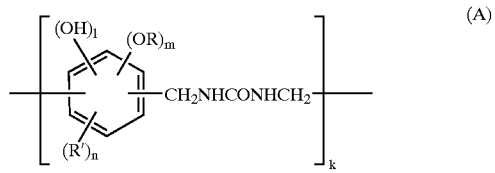

wherein I=1, 2, 3, or 4; m=0, 1, 2, or 3; n=0, 1, 2, or 3; I+m+n=1, 2, 3, or 4; k represents a repeating unit number; R represents an ether residue, an ester residue, a urethane residue, or a carbonate residue; and R' represents a monovalent organic group having not more than 20 carbon atoms, which may be substituted.

In another aspect, the photosensitive composition preferably comprises an o-quinone diazide compound.

In another aspect, the photosensitive composition preferably comprises a photosensitive diazonium compound.

In another aspect, the photosensitive composition preferably comprises an ethylenically unsaturated compound and a radical polymerization initiator.

In another aspect, the photosensitive composition preferably comprises a photothermal conversion material.

In another aspect, the photosensitive composition preferably comprises an acid generating agent, an acid crosslinking agent, and a photothermal conversion material.

A photosensitive planographic printing plate precursor according to the present invention is characterized by comprising a substrate and a photosensitive layer formed from the photosensitive composition according to the present invention provided on the surface of the substrate.

A method for manufacturing a planographic printing plate according to the present invention is characterized by comprising the steps of: exposing a photosensitive layer of the photosensitive planographic printing plate precursor according to the present invention to activating light rays, in a state of bringing a mask film of a silver salt having an image previously formed thereon into close contact with the photosensitive layer; and developing the photosensitive planographic printing plate obtained after the exposing step with an aqueous alkali solution.

In addition, a method for manufacturing a planographic printing plate according to the present invention is characterized by comprising the steps of: forming a latent image on a photosensitive layer of the photosensitive planographic printing plate precursor according to the present invention, using a laser beam based on digital image information; and developing the imaged photosensitive planographic printing plate precursor obtained after the step of forming the latent image with aqueous alkali solution.

Furthermore, the method for manufacturing a planographic printing plate according to the present invention may comprise the step of baking treating by subjecting the photosensitive planographic printing plate obtained after the developing step to a heat treatment.

DETAILED DESCRIPTION OF THE INVENTION

Phenol Resin Having a Urea Bond in the Main Chain

A photosensitive composition of the present invention comprises a phenol resin having a urea bond in the main chain. The term "phenol resin having a urea bond in the main chain" means a resin that (1) has a benzene nuclear having one or more phenolic hydroxyl groups and/or derivatives thereof, such as an ester, ether, urethane, or carbonate; and (2) has a urea bond (—NHCONH—), in the main chain.

In addition, among these resins, an alkali-soluble resin is preferable because a planographic printing plate produced therefrom can be developed with an alkali developer.

According to one method for producing a phenol resin applicable to the photosensitive composition of the present invention, as indicated in the reaction scheme (I) described below, the resin can be produced by condensation polymerization between a phenolic monomer and N,N'-dimethylolurea (DMU).

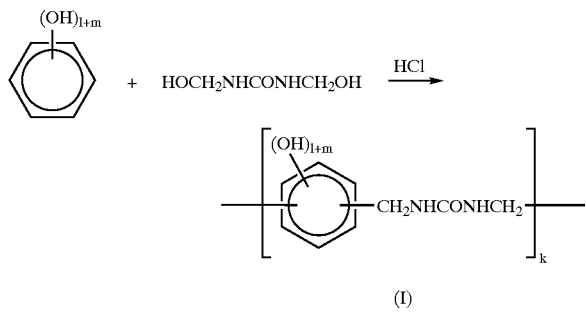

(I)

wherein l+m=1, 2, 3, or 4, and k represents a repeating unit number.

Examples of phenolic monomers include monohydroxybenzene derivatives that may have a substituent or substituents (the number of substituents is at most 3), dihydroxybenzene derivatives that may have a substituent or substituents (the number of substituents is at most 2), trihydroxybenzene derivatives that may have a substituent (the number of the substituent is at most 1), phenols such as tetrahydroxybenzene, bisphenols, naphthalenes, p-cresol/formaldehyde compounds having a low molecular weight, and the like.

Examples of monohydroxybenzene derivatives include phenol, o-cresol, m-cresol, p-cresol, 4-ethylphenol, 4-propylphenol, 4-butylphenol, 4-chlorophenol, 4-acetylphenol, 3-ethylphenol, 2-ethylphenol, 2,5-xylenol, 3,5-xylenol, and the like.

Examples of dihydroxybenzene derivatives include catechol, 4-methylcatechol, 4-ethylcatechol, 4-propylcatechol, 4-t-butylcatechol, 4-chlorocatechol, 4-bromocatechol, 4-acetylcatechol, 3-methoxycatechol, 3-chlorocatechol, 3-fluorocatechol, 3,5-di-t-butylcatechol, resorcinol, 4-methylresorcinol, 4-ethylresorcinol, 4-propylresorcinol, 4-hexylresorcinol, 4-t-butylresorcinol, 4-t-octylresorcinol, 4-chlororesorcinol, 4-bromoresorcinol, 4-acetylresorcinol, 2-methylresorcinol, 2-acetylresorcinol, 5-methylresorcinol, 5-methoxyresorcinol, 5-acetylresorcinol, 2,5-dimethylresorcinol, 4-carbetoxy-5-methylresorcinol, hydroquinone, methylhydroquinone, ethylhydroquinone, t-butylhydroquinone, phenylhydroquinone, acetylhydroquinone, chlorohydroquinone, bromohydroquinone, 2,6-dimethylhydroquinone, 2,5-di-t-butylhydroquinone, 2,5-di-t-pentylhydroquinone, and the like.

Examples of trihydroxybenzene above, include pyrogallol, 5-methylpyrogallol, 5-ethylpyrogallol, 5-propylpyrogallol, fluoroglucinol, 2-acetylfluoroglucinol, gallic acid, methyl gallate, ethyl gallate, benzyl gallate, 1,2,4-trihydroxybenzene, and the like.

As bisphenols, the compounds represented by the structural formula below are suitably used. Examples include biphenols such as 2,2'-biphenol, and 4,4'-biphenol, bisphenol A, bisphenol B, bisphenol S, tetramethylbisphenol A, 4,4'-cyclohexylidenebisphenol, 4,4'-ethylidenebisphenol, 4,4'-oxybisphenol, 2,2'-dihydroxydiphenylmethane, 2,4'-dihydroxydiphenylmethane, 4,4'-dihydroxydiphenylmethane, 4,4'-dihydroxydiphenyl sulfide, 4,4'-dihydroxydiphenyl sulfone, and the like.

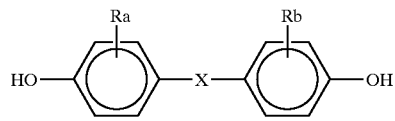

wherein Ra+Rb is less than or equal to 6; and X represents a single bond, S, O, SO, $SO_2$, $CH_2$, $C(CH_3)_2$, $CH_2CH_2$, or $(CH_2)_4$.

Examples of naphthalenes include 1-naphthol, 2-naphthol, 1,2-dihydroxynaphthalene, 1,3-dihydroxynaphthalene, 1,4-dihydroxynaphthalene, 1,5-dihydroxynaphthalene, 1,6-dihydroxynaphthalene, 1,7-dihydroxynaphthalene, 2,3-dihydroxynaphthalene, 2,7-dihydroxynaphthalene, 2,6-dihydroxynaphthalene, 1-acetyl-2-dihydroxynaphthalene, 2-acetyl-1-dihydroxynaphthalene, and the like.

Examples of p-cresol/formaldehyde compounds having a low molecular weight include of dinuclear compounds, trinuclear compounds, tetranuclear compounds, and pentanuclear compounds of p-cresol/formaldehyde condensates, and the mixtures thereof.

In addition, as the phenol resins of the present invention, the phenol resins wherein the hydroxyl group of the phenol resin is substituted by subjecting the phenol resin synthesized as described above to a modification reaction may also be preferably used. In particular, it is preferable that the hydroxyl group of the phenol resin be substituted by any one group selected from the group consisting of an ether group (—O—R"), an ester group (—OCO—R"), a urethane group (—OCO—NH—R"), a carbonate group (—OCO₂—R") in view of improvement in solvent resistance.

Examples of modification reactions of phenol resins include substitution reactions with various organic halides, organosilane compounds, or organosilyl chlorides, addition reactions with reactive compounds such as various isocyanate compounds or epoxy compounds. More particularly, there are, as indicated in the reaction scheme (II) described below, ether derivatives produced by a reaction with an organic halide in the presence of a basic compound; as indicated in the reaction scheme (III) described below, silyl ether derivatives produced by a reaction with an organosilyl chloride in the presence of a basic compound; as indicated in the reaction scheme (IV) described below, silyl ether derivatives produced by a reaction with an organosilane or a siloxane in the presence of a basic compound; as indicated in the reaction schemes (V) to (VII) described below, ester derivatives produced by a reaction with an organic acid chloride such as an organic acid chloride, an organosulfonic acid chloride or an organophosphoric acid chloride in the presence of a basic compound; as indicated in the reaction scheme (VIII) described below, carbonate derivatives produced by a reaction with various chloroformates in the presence of a basic compound; as indicated in the reaction scheme (IX) described below, urethane derivatives produced by an addition reaction with various isocyanates; and as indicated in the reaction scheme (X) described below, ether derivatives produced by an addition reaction with various epoxy compounds.

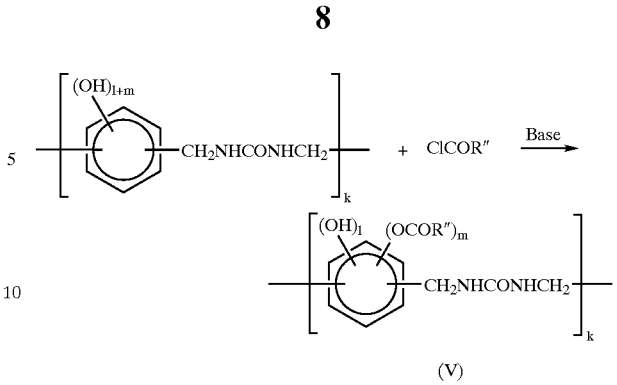

(II)

wherein l+m=1, 2, 3, or 4; and k represents a repeating unit number.

(III)

wherein l+m=1, 2, 3, or 4; and k represents a repeating unit number.

(IV)

wherein l+m=1, 2, 3, or 4; and k represents a repeating unit number.

(V)

wherein l+m=1, 2, 3, or 4; and k represents a repeating unit number.

(VI)

wherein l+m=1, 2, 3, or 4; and k represents a repeating unit number.

(VII)

wherein l+m=1, 2, 3, or 4; and k represents a repeating unit number.

(VIII)

wherein l+m=1, 2, 3, or 4; and k represents a repeating unit number.

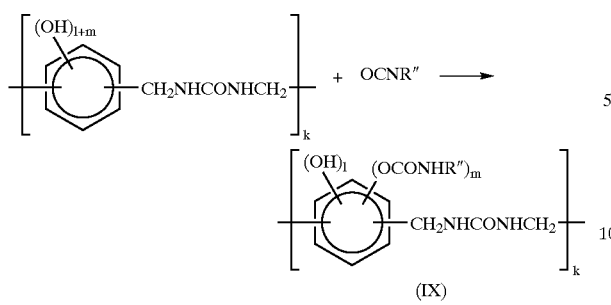

(IX)

wherein l+m=1, 2, 3, or 4; and k represents a repeating unit number.

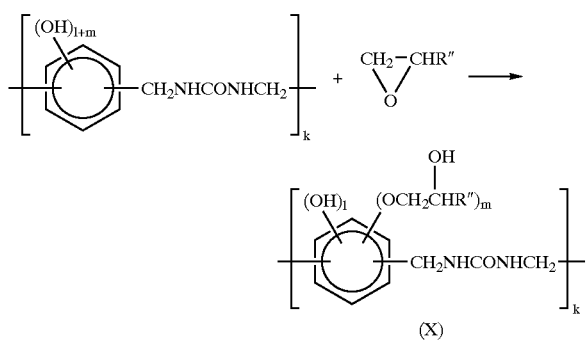

(X)

wherein l+m=1, 2, 3, or 4; and k represents a repeating unit number.

Examples of basic compounds used in the modification reactions of the phenol resins include tertiary amine compounds such as trimethylamine, triethylamine, tripropylamine, tributylamine, hexamethylene tetramine, and pyridine N-methylmorpholine.

The substituent R" described above is a hydrocarbon group that may have one or more substituents, examples of which preferably include a straight-chain, branched, or cyclic alkyl group having not more than 20 carbon atoms; an aryl group having 6 to 20 carbon atoms; a straight-chain, branched, or cyclic alkenyl group having 2 to 20 carbon atoms; a straight-chain, branched, or cyclic alkynyl group having 2 to 20 carbon atoms; and may be a hetero compound wherein the carbon atom in the substituent is substituted with a hetero atom such as a sulfur atom, a nitrogen atom, an oxygen atom, or a phosphorus atom.

In addition, in the case of having one or more substituents, examples of preferable substituents include a hydrocarbon group having not more than 12 carbon atoms, an alkoxy group, an ester group, an acetyl group, a substituted amino group, a ureido group, a halogen atom, and the like.

Examples of preferable substituent R" include a methyl group, an ethyl group, a propyl group, an isopropyl group, a butyl group, an isobutyl group, a t-butyl group, a sec-butyl group, a pentyl group, a hexyl group, a cyclopentyl group, a cyclohexyl group, an octyl group, a benzyl group, a mesityl group, a toluyl group, a phenyl group, a naphthyl group, an allyl group, and a vinyl group, which may be substituted.

Furthermore, examples of heterocyclic groups include an indol ring, an imidazole ring, a triazole ring, a benzotriazole ring, a tetrazole ring, a thiazole ring, a benzothiazole ring, an oxazole ring, and a benzoxazole ring, which may be substituted.

In addition, as the phenol resins of the present invention, those produced by a condensation reaction between phenols wherein a hydroxyl group is previously substituted and dimethylolurea can be preferably used. Examples of phenols wherein the hydroxyl group is previously substituted include monomethylcatechol, monoethylcatechol, monobenzylcatechol, resorcinol monobenzyl ester, resorcinol monoacetyl ester, resorcinol monomethyl ether, resorcinol monoethyl ether, resorcinol monobenzyl ether, resorcinol mono-n-butyl ether, hydroquinone monomethyl ether, hydroquinone monoethyl ether, hydroquinone n-propyl ether, hydroquinone mono-n-butyl ether, hydroquinone n-pentyl ether, hydroquinone n-hexyl ether, hydroquinone n-heptyl ether, hydroquinone n-octyl ether, pyrogallol 1-monomethyl ether, pyrogallol 1,3-dimethyl ether, fluoroglucinol monomethyl ether, fluoroglucinol dimethyl ether, and the like.

Among these phenol resins synthesized as described above, the phenol resins having a structural unit represented by the general formula (A) are preferable, and those having a structural unit represented by the general formula (A) in the amount of 10 to 90% by weight are particularly preferable. If the amount of the structural unit represented by the general formula (A) is below 10% by weight, solvent resistance may be insufficient. On the other hand, if the amount exceeds 90% by weight, the resins may be insoluble in the solvent used during application thereof.

In addition, solvent resistance is improved as the molecular weight is increased. However, if solvent resistance is increased too much, the resins cannot be dissolved in the coating solvents. For these reasons, in the molecular weight of the phenol resin having the structural unit represented by the general formula (A), the weight-average molecular weight is 1000 or more, and is preferably in the range of from 2000 to 50000, and the number-average molecular weight is 500 or more, and is preferably in the range of from 1000 to 20000.

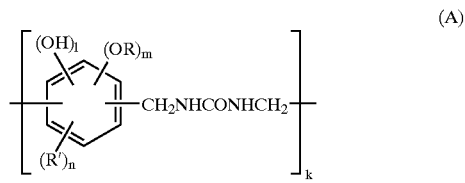

(A)

wherein l=1, 2, 3, or 4; m=0, 1, 2, or 3; n=0, 1, 2, or 3; l+m+n=1, 2, 3, or 4; k represents a repeating unit number; R represents an ether residue (for example, —R", or —Si(R")$_3$), an ester residue (for example, —CO—R"), a urethane residue (for example, —CO—NH—R"), or a carbonate residue (for example, —CO$_2$—R"); and R' and R" represent a monovalent organic group having not more than 20 carbon atoms, which may be substituted.

The amount of the phenol resin having a urea bond in the main chain (alkali-soluble resin) is preferably in the range of from 5 to 95% by weight, and is more preferably in the range of from 10 to 90% by weight, with respect to the solid contents in total of the photosensitive composition. If the amount of the phenol resin described above is below 10% by weight, the developability, solvent resistance, and wear resistance of the coating film formed from the photosensitive composition may be insufficient. On the other hand, if the amount exceeds 95% by weight, developer resistance of the coating film tends to be lowered.

Photosensitive Composition

Examples of the photosensitive composition of the present invention include (1) positive-working photosensitive compositions containing a phenol resin having a urea bond in the main chain and a quinone diazide compound; (2) negative-working photosensitive compositions containing a phenol resin having a urea bond in the main chain and a photosensitive diazonium compound; (3) negative-working photosensitive compositions containing a phenol resin having a urea bond in the main chain, an ethylenically unsaturated compound, and a radical polymerization initiator, for an infrared laser (for use in CTP); (4) positive-working photosensitive compositions containing a phenol resin having a urea bond in the main chain and a photothermal conversion material, for an infrared laser (for use in CTP); and (5) negative-working photosensitive compositions containing a phenol resin having a urea bond in the main chain, an acid generating agent, an acid crosslinking agent, and a photothermal conversion material, for an infrared laser (for use in CTP).

(1) Positive-Working Photosensitive Compositions Containing an o-quinone Diazide Compound The o-quinone diazide compound is a compound having at least one o-quinone diazide group, and is preferably a compound wherein the solubility to an aqueous alkali solution increases due to activating light rays. For these compounds, compounds having various structures are known, and are described in detail on pages 336 to 352 of "Light-Sensitive Systems" (John Wiley & Sons, 1965), edited by J. KOSAR.

As the o-quinone diazide compound, esters of various hydroxyl compounds and o-benzoquinone diazide or o-naphthoquinone diazide sulfonic acid are particularly preferable. As these o-naphthoquinone diazide compounds, isomers such as 1,2-naphthoquinonediazide-5-sulfonate, and 1,2-naphthoquinonediazide-6-sulfonate are known, and can be preferably used in the present invention.

Examples of the o-quinone diazide compound described above include esters of 1,2-naphthoquinone-2-diazide-5-sulfonyl chloride and a phenol-formaldehyde resin or a cresol-formaldehyde resin; esters of 1,2-naphthoquinone-2-diazide-5-sulfonyl chloride and a pyrogallol-acetone resin; esters of 1,2-naphthoquinone-2-diazide-5-sulfonyl chloride and a resorcinol-benzaldehyde resin; esters of 1,2-naphthoquinone-2-diazide-5-sulfonyl chloride and a resorcinol-pyrogallol-acetone co-condensed resin; compounds obtained by esterifying a polyester having a hydroxyl group at a terminal with 1,2-naphthoquinone-2-diazide-5-sulfonyl chloride; compounds obtained by esterifying a homopolymer of N-(4-hydroxyphenyl) methacrylamide or a copolymer of another copolymerizable monomer with 1,2-naphthoquinone-2-diazide-5-sulfonyl chloride; esters of 1,2-naphthoquinone-2-diazide-5-sulfonyl chloride and a bisphenol-formaldehyde resin; compounds obtained by esterifying a homopolymer of p-hydroxystyrene or a copolymer of another copolymerizable monomer with 1,2-naphthoquinone-2-diazide-5-sulfonyl chloride; and esters of 1,2-naphthoquinone-2-diazide-5-sulfonyl chloride and polyhydroxybenzophenone.

Other examples of the publicly known o-quinone diazide compounds include those described in Japanese Unexamined Patent Application, First Publication No. Sho 62-27932, Japanese Unexamined Patent Application, First Publication No. Hei 4-153656, Japanese Unexamined Patent Application, First Publication No. Hei 10-198030, Japanese Unexamined Patent Application, First Publication No. Hei 11-143066, Japanese Unexamined Patent Application, First Publication No. Hei 11-242325, Japanese Unexamined Patent Application, First Publication No. Hei 11-305429, and the like.

The added amount of the o-quinone diazide compound described above is preferably in the range of from 5 to 60% by weight, and more preferably from 10 to 40% by weight, based on the total solid content of the photosensitive composition.

The positive-working photosensitive composition can contain a publicly known alkali-soluble resin, in addition to the phenol resin having a urea bond in the main chain. Examples include novolac resins or resol resins such as a m-cresol-formaldehyde resin, a p-cresol-formaldehyde resin, a m-/p-mixed cresol-formaldehyde resin, a phenol/cresol (any one of m-, p-, or m-/p-mixed) mixed formaldehyde resin, a phenol-formaldehyde resin, or a resorcinol-formaldehyde resin; polyhydroxystyrenes; acrylic resins described in Japanese Unexamined Patent Application, First Publication No. Hei 8-339082; and urethane resins described in Japanese Unexamined Patent Application, First Publication No. Sho 63-124047.

The photosensitive composition of the present invention has a feature such that development latitude is further widened by employing these publicly known resins in combination, and a novolac resin is used particularly preferably in combination with a quinone diazide compound. The number-average molecular weight of the alkali-soluble resin is preferably in a range of from 200 to 20,000, and the weight-average molecular weight is preferably in a range of from 300 to 60,000.

In addition, in the positive-working photosensitive composition, cyclic acid anhydrides to enhance the sensitivity, print-out agents to obtain visible images immediately after exposure, dyes as image coloring agents, and other fillers can be added, if necessary.

Examples of the cyclic acid anhydride include succinic anhydride, glutaric anhydride, itaconic anhydride, phthalic anhydride, tetrahydrophthalic anhydride, hexahydrophthalic anhydride, maleic anhydride, chloromaleic anhydride, and pyromellitic anhydride. These cyclic acid anhydrides can be added in an amount ranging from 1 to 15% by weight based on the entire composition.

Examples of the print-out agent to obtain visible images immediately after exposure include a combination of a photosensitive compound capable of generating an acid by exposure and an organic dye capable of forming a salt with an acid to change color tone.

Examples of the photosensitive compound capable of generating an acid by exposure include o-naphthoquinonediazide-4-sulfonic acid halogenides; trihalomethyl-2-pyrones or trihalomethyl-s-triazines; various o-naphthoquinone diazide compounds; 2-trihalomethyl-5-aryl-1,3,4-oxadiazole compounds; and diazonium salts. These compounds can be used alone or in combination therewith, and the added amount thereof is preferably in the range of from 0.3 to 15% by weight based on the total weight of the composition.

Examples of the organic dye capable of forming a salt include a triphenylmethane dye, a cyanine dye, a diazo dye, and a styryl dye, and specific examples thereof include Crystal Violet, Ethyl Violet, Methyl Violet, Methylene Blue, Victoria Blue BH, Victoria Pure Blue BOH, Malachite Green, Oil Blue #603, Oil Green BG, Brilliant Green, fuchsine, eosin, Rhodamine B, Oil Pink #312, Oil Red 5B, Oil Black BS, Oil Yellow #101, phenolphthalein, Cresol Red, auramine, Leucocrystal Violet, and Leucomalachite Green. The added amount thereof is preferably in a range of from 0.3 to 15% by weight based on the total weight of the composition.

In addition thereto, in the positive-working photosensitive compositions, various additives can be added depending on the purpose, examples of which include various resins having a hydrophobic group to improve the inking properties of the image, such as an octylphenol-formaldehyde resin, a t-butylphenol-formaldehyde resin, a t-butylphenol-benzaldehyde resin, a rosin-modified novolac resin, and o-naphthoquinonediazide sulfonic esters of these modified novolac resins; and plasticizers to improve the pliability of the coating film, such as dibutyl phthalate, dioctyl phthalate, butyl glycolate, tricresyl phosphate, and dioctyl adipate. The added amount thereof is preferably in the range of from 0.01 to 30% by weight based on the total weight of the composition.

(2) Negative-Working Photosensitive Compositions Containing a Photosensitive Diazonium Compound Examples of the photosensitive diazonium compound include, for example, a diazo resin represented by a salt of a condensate of a diazodiarylamine and an active carbonyl compound.

Examples of the particularly preferable diazo resins include, for example, organic acid salts or inorganic acid salts of condensates between 4-diazodiphenylamine, 4-diazo-3-methyldiphenylamine, 4-diazo-4'-methyldiphenylamine, 4-diazo-3'-methyldiphenylamine, 4-diazo-4'-methoxydiphenylamine, 4-diazo-3-methyl-4'-ethoxydiphenylamine, or 4-diazo-3-methoxydiphenylamine, and formaldehyde, paraformaldehyde, acetaldehyde, benzaldehyde, or 4,4'-bis-methoxymethyl diphenyl ether.

Examples of the organic acid of the diazo resin include, for example, methanesulfonic acid, benzenesulfonic acid, toluenesulfonic acid, xylenesulfonic acid, mesitylenesulfonic acid, dodecylbenzenesulfonic acid, naphthalenesulfonic acid, propylnaphthalenesulfonic acid, 1-naphthol-5-sulfonic acid, 2-nitrobenzenesulfonic acid, 3-chlorobenzenesulfonic acid, and 2-hydroxy-4-methoxybenzophenone-5-sulfonic acid, and examples of the inorganic acid include hexafluorophosphoric acid, tetrafluoroboric acid, and thiocyanic acid.

Furthermore, a diazo resin wherein a main chain is a polyester group; a diazo resin obtained by reacting a polymer having a carboxylic anhydride residue with a diazo compound having a hydroxyl group; and a diazo resin obtained by reacting a polyisocyanate compound with a diazo compound having a hydroxyl group can be used. The amount of these diazo resins is preferably in the range of from 5 to 40% by weight based on the solid content of the composition, and if necessary, two or more kinds of the diazo resins may be used in combination.

In the negative-working photosensitive compositions, publicly known additives such as dyes, pigments, plasticizers, and stability modifiers can be added to improve the performances.

Examples of the preferable dye include basic oil-soluble dyes such as Crystal Violet, Malachite Green, Victoria Blue, Methylene Blue, Ethyl Violet, and Rhodamine B. Examples of the commercially available products thereof include "Victoria Pure Blue BOH" (Hodogaya Chemical Industries, Co., Ltd.), and "Oil Blue #603" (Orient Chemical Industries, Ltd.). Examples of the pigment include Phthalocyanine Blue, Phthalocyanine Green, Dioxadine Violet, and Quinacridone Red.

Examples of the plasticizer include diethyl phthalate, dibutyl phthalate, dioctyl phthalate, tributyl phosphate, trioctyl phosphate, tricresyl phosphate, tri(2-chloroethyl) phosphate, and tributyl citrate.

Furthermore, as publicly known stability modifiers, for example, phosphoric acid, phosphorous acid, oxalic acid, tartaric acid, malic acid, citric acid, dipicolinic acid, polyacrylic acid, benzenesulfonic acid, and toluenesulfonic acid can be used in combination.

The added amount of these additives varies depending on the purpose, but is preferably, in general, in the range of 0 to 30% by weight based on the solid content of the photosensitive composition.

(3) Negative-Working Photosensitive Compositions Containing an Ethylenically Unsaturated Compound and a Radical Polymerization Initiator for an Infrared Laser (for Use in CTP)

The ethylenically unsaturated compound is a monomer or oligomer that has a boiling point under normal pressure of 100° C. or higher and also has at least one, preferably 2 or more, addition-polymerizable ethylenically unsaturated groups per molecule. Examples of the monomer or oligomer described above include, for example, monofunctional (meth)acrylates such as polyethylene glycol mono(meth) acrylate [hereinafter, methacrylate and acrylate are generically referred to as (meth)acrylate], polypropylene glycol mono(meth)acrylate, and phenoxyethyl (meth)acrylate; and polyfunctional (meth)acrylates such as polyethylene glycol di(meth)acrylate, polypropylene glycol di(meth)acrylate, trimethylolpropane tri(meth)acrylate, neopentyl glycol di(meth)acrylate, pentaerythritol tri(meth)acrylate, pentaerythritol tetra(meth)acrylate, dipentaerythritol hexa (meth)acrylate, hexanediol di(meth)acrylate, tri (acryloyloxyethyl) isocyanurate, (meth)acrylates of polyhydric alcohol-alkylene oxide adducts, (meth)acrylates of polyhydric phenol-alkylene oxide adducts, urethane acrylates, polyester acrylates, and epoxy acrylates obtained by the addition reaction between an epoxy resin and (meth) acrylic acid.

The amount of these compounds having an addition-polymerizable ethylenically unsaturated group is preferably in the range of from 5 to 70% by weight based on the solid content of the composition.

As the radical polymerization initiator, various photoinitiators known from patents and references, or combinations (photoinitiation systems) of a radical polymerization initiator and a sensitizing pigment can be appropriately selected and used according to the wavelength of the light source used. In the case of using light having a wavelength of about 400 nm as the light source, benzyl, benzoin ether, Michler's ketone, anthraquinone, thioxanthone, acridine, phenazine, and benzophenone are widely used.

In addition, in the case of using a laser of visible light or near infrared light having a wavelength of 400 nm more as the light source, various photoinitiation systems using the radical polymerization initiator in combination with the sensitizing pigment are proposed. The radical polymerization initiator is not specifically limited and may be any one as long as it can form active species, which are required to subject the addition-polymerizable compound component having an ethylenically unsaturated double bond in the photopolymerizable composition of the present invention to the polymerization reaction, by means of the electron transfer reaction or the energy from the sensitizing pigment that has absorbed visible light or near infrared light energy.

Examples of the radical polymerization initiator used in the present invention include, for example, bisimidazole compounds such as 2,2'-bis(o-chlorophenyl)-4,4',5,5'-tetraphenyl-1,1'-biimidazole, and 2,2'-bis(o-chlorophenyl)-4,4',5,5'-tetrakis(2,3-dimethoxyphenyl)-1,1'-biimidazole; 2,4,6-substituted 1,3,5-triazine compounds such as 2,4,6-tris (trichloromethyl)-1,3,5-triazine, 2-methyl-4,6-bis (trichloromethyl)-1,3,5-triazine, 2-phenyl-4,6-bis (trichloromethyl)-1,3,5-triazine, 2,4-bis(trichloromethyl)-6-(p-methoxyphenyl-vinyl)-1,3,5-triazine, and 2-(4'-methoxy-1'-naphthyl)-4,6-bis(trichloromethyl)-1,3,5-triazine; onium salt compounds such as diaryliodonium salts and triarylsulfonium salts obtained by using diphenyliodonium, 4,4'-dichlorodiphenyliodonium, 4,4'-dimethoxydiphenyliodonium, 4,4'-di-t-butylidiphenyliodonium, 4-methyl-4'-isopropyl-diphenyliodonium, or 3,3'-dinitrodiphenyliodonium in combination with chloride, bromide, tetrafluoroborate, hexafluorophosphate, hexafluoroarsenate, hexafluoroantimonate, tetrakis(pentafluorophenyl) borate, or trifluoromethanesulfonic acid; metal arene complexes such as titanocene and ferrocene; benzoin ether compounds such as benzyl, benzoin, benzoin alkyl ether, and 1-hydroxycyclohexyl phenyl ketone; ketal compounds such as benzyl alkyl ketal; acetophenone compounds such as 2,2'-dialkoxyacetophenone, 2-hydroxy-2-methylpropiophenone, p-t-butyltrichloroacetophenone, and p-t-butylcycloacetophenone; benzophenone compounds such as benzophenone, 4-chlorobenzophenone, 4,4'-dichlorobenzophenone, methyl o-benzoylbenzoate, 3,3'-dimethyl-4-methoxybenzophenone, 4-benzoyl-4'-methyldiphenyl sulfide, and dibenzosuberone; thioxanthone compounds such as thioxanthone, 2-chlorothioxanthone, 2-alkylthioxanthone, and 2,4-dialkylthioxanthone; anthraquinone compounds; peroxides such as 3,3',4,4'-tetra(t-butylperoxycarbonyl)benzophenone; and N-arylglycine compounds such as N-phenylglycine, N-(p-chlorophenyl) glycine, N-hydroxyethyl-N-phenylglycine, and N-(2-hydroxy-3-methacryloxypropyl)-N-phenylglycine. In the present invention, the radical polymerization initiators described above may be optionally used in combination of two or more kinds thereof.

The sensitizing pigments can absorb visible light or near infrared light. Examples of the sensitizing pigments described above include, for example, azo pigments, anthraquinone pigments, benzoquinone pigments, naphthoquinone pigments, diaryl and triaryl methane pigments, cyanine pigments, merocyanine pigments, fluoran pigments, squarylium pigments, croconium pigments, pyrylium pigments, thiopyrylium pigments, phthalocyanine derivatives, naphthalocyanine derivatives, indigo pigments, cumarin pigments, ketocumarin pigments, quinacridone pigments, quinophthalone pigments, pyrrolopyrrole pigments, benzodifuranone pigments, acridine pigments, oxazine pigments, thiazine pigments, xanthene pigments, thioxanthene pigments, styryl pigments, spiropyran pigments, spirooxazine pigments, and organic ruthenium complexes. In addition, as the sensitizing pigments described above, any pigments described in already-known publications can be used such as "Functional Pigments" (1992, Kodansha Scientific), edited by Makoto OHGAWARA, et al.; "Chemistry and Application of Pigments" (1994, Dainippon Tosho), edited by Ken MATSUOKA; and "Pigment Handbook" (1986, Kodansha), edited by Makoto OHGAWARA, et al. In the photopolymerizable compositions of the present invention, two or more kinds selected from the above sensitizing pigments or pigments can be optionally used in combination as the sensitizing pigments to absorb light having a corresponding wavelength.

The total amount of the radical polymerization initiator and the sensitizing pigment is preferably in the range of from 0.5 to 20% by weight based on the solid content of the composition.

In addition, in the negative-working photosensitive composition, publicly-known additives such as dyes, pigments, plasticizers, and stability modifiers can be added to improve the performances, in the same manner as described in the above negative-working photosensitive composition (2).

The added amount of these additives varies depending on the purpose, but is preferably, in general, in the range of from 0 to 30% by weight based on the solid content of the photosensitive composition.

The features of the negative-working photosensitive compositions (2) and (3) described above are that, when using a photosensitive diazonium compound, adhesion between a photosensitive layer and a substrate is good, and that, when using an ethylenically unsaturated compound in combination with a radical polymerization initiator, a tough coating film can be obtained by exposure. In addition, when using a photosensitive diazonium compound, an ethylenically unsaturated compound, and a radical polymerization initiator in combination, a coating film having the two features described above can be obtained.

Furthermore, in the negative-working photosensitive compositions (2) and (3) described above, the following resins can be used as the binder resin: copolymers such as a (meth)acrylic acid-(meth)acrylate copolymer, a copolymer containing a hydroxyalkyl (meth)acrylate and (meth)acrylonitrile, having an acid value of 10 to 100, a copolymer having an aromatic hydroxyl group, and a polymer having a 2-hydroxy-3-phenoxypropyl (meth)acrylate unit; epoxy resins; polyamide resins; vinyl halides, in particular, polyvinyl chloride and polyvinylidene chloride; polyvinyl acetates; polyesters; acetal resins such as a formal resin and a butyral resin; soluble polyurethane resins that are commercially available from Goodrich U.S.A. under the trade name of Estan; polystyrenes; styrene-maleic anhydride copolymers or semi-esters thereof; cellulose derivatives; shellac; rosins or modified compounds thereof; and copolymers having an unsaturated group in the side chain.

(4) Positive-Working Photosensitive Compositions Containing Photothermal Conversion Material, for an Infrared Laser (for Use in CTP)

The photothermal conversion material is a substance that has a light absorption range in a near infrared to infrared range having a wavelength in the range of from 700 to 3000 nm, and preferably from 750 to 1200 nm, and absorbs light to generate heat. Examples of the substance include various pigments and dyes.

As the pigments for the present invention, commercially available pigments can be used. Examples of the pigments include black pigments, yellow pigments, orange pigments, brown pigments, red pigments, violet pigments, blue pigments, green pigments, fluorescent pigments, and other polymer bonded pigments. Specifically, insoluble azo pigments, azo lake pigments, condensed azo pigments, chelate azo pigments, phthalocyanine pigments, anthraquinone pigments, perylene and perinone pigments, thioindigo pigments, quinacridone pigments, dioxazine pigments, isoindolinone pigments, quinophthalone pigments, dyeing lake pigments, azine pigments, nitroso pigments, nitro pigments, natural pigments, fluorescent pigments, inorganic pigments, and carbon black can be used.

Among these pigments, in particular, carbon black is preferably used as a substance that absorbs light in the near infrared to infrared range to efficiently generate heat and is economically excellent.

These pigments may be used without being subjected to a surface treatment, or may be used after being subjected to a publicly known surface treatment. Examples of the method for publicly known surface treatments include a method of coating the surface with a resin or wax, a method of adhering a surfactant to the surface, and a method of depositing a reactive substance such as a silane coupling agent, an epoxy compound, or a polyisocyanate, on the surface of the pigment.

The particle size of the pigment used in the present invention is preferably in the range of from 0.01 to 15 micrometers, and is more preferably in the range of from 0.01 to 5 micrometers. Grafted carbon black, wherein the dispersibility in the dispersion solvent was improved by graft polymerization, is in particular, preferably used in the photosensitive compositions of the present invention.

Examples of the dye used in the present invention include cyanine dye, squarylium dye, croconium dye, azulenium dye, phthalocyanine dye, naphthalocyanine dye, polymethine dye, naphthoquinone dye, thiopyrylium dye, dithiol metal complex dye, anthraquinone dye, indoaniline dye, and intermolecular CT dye. Specific examples of the dye described above include the compounds described in Japanese Unexamined Patent Application, First Publication No. 2000-310852, Japanese Unexamined Patent Application, First Publication No. 2000-199950, and Japanese Unexamined Patent Application, First Publication No. 2000-131837.

Examples of the commercially available products include IR750 (anthraquinone compounds); IR002 and IR003 (aluminum compounds); IR820 (polymethine compound); IRG022 and IRG033 (diimmonium compounds); CY-2, CY-4, CY-9, and CY-20, which are commercially available from Nippon Kayaku Kabushiki Kaisha; KIR103 and SIR103 (phthalocyanine compounds); KIR101 and SIR114 (anthraquinone compounds); PA1001, PA1005, PA1006, and SIR128 (metal complex compounds), which are commercially available from Mitsui Chemicals; Fastogen blue 8120, which is commercially available from DAINIPPON INK & CHEMICALS Co., Ltd.; MIR-101, 1011, and 1021, which are commercially available from Midori Chemical Co., Ltd.; Pro-JET 825LDI, Pro-JET 830DI, S-175139/1, S-175139/2, S-175140/5, S-175140/6, S-178376/1, and S-189632/1, which are commercially available from AVECIA Company; S-0094, S-0121, S-0229, S-0253, S-0260, S-0270, S-0306, S-0322, S-0325, S-0337, S-0345, S-0378, S-0389, S-0391, S-0402, S-0447, S-0450, S-0484, S-0492, and S-0585, which are commercially available from FEW Company; and compounds which are commercially available from Nihon Kanko Shikiso Co., Ltd., Sumitomo Chemical Industries Co., Ltd., and Fuji Photo Film Co., Ltd.

As the photothermal conversion material, an appropriate pigment or dye, which can absorb light having a specific wavelength from the light source below and can convert light into heat, can be used by appropriately selecting from the above pigments or dyes. In the case of using the pigment or dye as the photothermal conversion material, the amount thereof is preferably in the range of from 0.01 to 50% by weight, and is particularly preferably in the range of from 0.1 to 20% by weight, based on the total solid content of the positive-working photosensitive composition. If the amount of the pigment is less than 0.01% by weight, the developer resistance of the image portion is lowered. On the other hand, if the amount is more than 50% by weight, the developability of the non-image portion (exposed portion) is lowered. Therefore, they are not preferable.

These photothermal conversion materials, in general, have a function of substantially lowering the solubility in an aqueous alkali solution of a photosensitive composition containing an alkali-soluble resin, and impart the resistance to the alkali developer to the non-exposed portion.

It is also possible to simultaneously use another compound having a function of substantially lowering the solubility in the aqueous alkali solution of the photosensitive composition containing an alkali-soluble resin. Examples of the compound described above include, for example, onium salts, aromatic sulfone compounds, aromatic sulfonate compounds, phosphate compounds, aromatic carboxylate compounds, aromatic disulfone compounds, aromatic ketone compounds, aromatic aldehyde compounds, aromatic ether compounds, and o-quinone diazide compounds.

In the positive-working photosensitive compositions for an infrared laser, if necessary, publicly known additives, such as cyclic acid anhydrides to enhance the sensitivity, print-out agents to obtain visible images immediately after exposure, dyes as image coloring agents, various resins having a hydrophobic group to improve the inking properties of the image, plasticizers to improve the pliability of the coating film, and publicly-known resins added to improve the wear resistance of the coating film can be added.

Examples of the cyclic acid anhydride include succinic anhydride, glutaric anhydride, itaconic anhydride, phthalic anhydride, tetrahydrophthalic anhydride, hexahydrophthalic anhydride, maleic anhydride, chloromaleic anhydride, trimellitic anhydride, and pyromellitic anhydride. The added amount thereof is preferably not more than 15% by weight in the photosensitive composition.

Examples of print-out agents to obtain visible images immediately after exposure include a combination of a heat-sensitive compound that generates an acid by exposure to high-density energy light, and an organic dye that forms a salt with an acid to change the color tone.

Examples of the heat-sensitive compound, that generates an acid by exposure to high-density energy light, include various onium salt compounds such as a publicly known diazonium salt, an ammonium salt, a phosphonium salt, a sulfonium salt, an iodonium salt, an arsonium salt, and an onium borate complex; various halide compounds such as an s-triazine compound substituted with a trihalomethyl group, an oxazole compound substituted with a trihalomethyl group, other organic halide compounds, a combination of an organometal and an organohalide compound; various compounds that can generate sulfonic acid by decomposition, such as a disulfonic acid compound or an iminosulfonate compound; and acid generating agents having an o-nitrobenzyl type protective group. In addition, the compounds wherein the groups or compounds generating an acid described above are introduced into the main chain or the side chain of the polymer can also be preferably used. In addition, the added amount thereof is not more than 15% by weight in the photosensitive composition.

Examples of the organic dye, which can form a salt with an acid, include a triphenylmethane dye, a cyanine dye, a diazo dye, and a styryl dye. Specific examples thereof include Crystal Violet, Ethyl Violet, Methyl Violet, Methylene Blue, Victoria Blue BH, Victoria Pure Blue BOH, Oil Blue #603, Malachite Green, Oil Green BG, Brilliant Green, fuchsine, eosin, Rhodamine B, Oil Pink #312, Oil Red 5B, Oil Black BS, Oil Yellow #101, phenolphthalein, Cresol Red, auramine, Leucocrystal Violet, and Leucomalachite Green. The added amount thereof is not more than 15% by weight in the photosensitive composition.

Examples of the dye as the image coloring agent include a stilbene dye, a benzophenone dye, a benzoquinone dye, a naphthoquinone dye, a squarylium dye, an oxidation dye, a sulfide dye, a reactive dye, and a fluorescent whitening dye. The added amount thereof is not more than 15% by weight in the positive-working photosensitive composition.

Examples of various resins having a hydrophobic group to improve the inking properties of the image include an octylphenol-formaldehyde resin, a t-butylphenol-formaldehyde resin, a t-butylphenol-benzaldehyde resin, a rosin-modified novolac resin, and esters of these modified novolac resins.

Examples of the plasticizer to improve the pliability of the coating film include diethyl phthalate, dioctyl phthalate, butyl glycolate, tricresyl phosphate, and dioctyl adipate.

Examples of the publicly-known resins added to improve the wear resistance of the coating film include polyvinyl acetal resins, polyurethane resins, epoxy resins, vinyl chloride resins, nylon, polyester resins, and acrylic resins.

The added amount of each of these additives is usually not more than 15% by weight with respect to the positive-working photosensitive composition, and the total amount is not more than 40% by weight.

(5) Negative-Working Photosensitive Compositions Containing an Acid Generating Agent, an Acid Crosslinking Agent, and a Photothermal Conversion Material, for an Infrared Laser (for Use in CTP)

Examples of compounds that generate an acid by heat include publicly-known onium salts such as ammonium salts, phosphonium salts, iodonium salts, sulfonium salts, and selenonium salts; organic halogen compounds; photo acid generators having an o-nitrobenzyl type protective group; and disulfone compounds. In particular, trihaloalkyl compounds and diazonium salts can be preferably used because high sensitivity can be obtained. In addition, if necessary, two or more kinds of compounds that generate an acid by heat may be used in combination.

Examples of the trihaloalkyl compound include the trihalomethyl-s-triazine compounds described in U.S. Pat. No. 4,239,850, and oxadiazole compounds and tribromomethylsulfonyl compounds described in U.S. Pat. No. 4,212,970.

As the diazonium salts, the above photosensitive diazonium compounds can be used.

The amount of the compound that generates an acid by heat is preferably in the range of from 0.01 to 50% by weight, and, in particular, is preferably in the range of from 0.1 to 20% by weight, based on the solid content of the negative-working photosensitive composition. If the amount of the compound that generates an acid by heat is less than 0.01% by weight, it is impossible to expect the generation of an acid sufficient to crosslink with an acid crosslinking agent. On the other hand, if the amount exceeds 50% by weight, the solubility in a developer of the non-image portion is drastically lowered.

The acid crosslinking agent is not specifically limited and may be any one as long as it is crosslinked and becomes insoluble by the catalytic action of the acid generated from the compound that generates an acid by heat.

Examples of the acid crosslinking agents include amino compounds having at least two groups from among a methylol group, an alkoxymethyl group, and an acetoxymethyl group. Specific examples thereof include melamine derivatives such as methoxymethylated melamines, benzoguanamine derivatives, or glycol uril derivatives, urea resin derivatives, and resol resins.

Among these, a resol resin is preferably used because the solubility of the image portion/non-image portion in the developer and contrast are enhanced.

The amount of the acid crosslinking agent is preferably in the range of from 5 to 70% by weight with respect to the solid content of the negative-working photosensitive composition. In addition, if necessary, two or more kinds of compounds that are crosslinked with an acid may be used in combination.

As the photothermal conversion material, pigments or dyes described for the positive-working photosensitive composition for an infrared laser (4) can be used.

The amount of the photothermal conversion material is preferably in the range of from 3 to 20% by weight with respect to the solid content of the negative-working photosensitive composition. If the amount of the photothermal conversion material is less than 3% by weight, sufficient heat cannot be generated even if light is absorbed to generate heat. On the other hand, if the amount exceeds 20% by weight, the heat generated is substantially saturated, and the addition effect is not enhanced. Therefore, they are not preferable.

In the negative-working photosensitive composition for an infrared laser, publicly-known additives, such as dyes as image coloring agents, plasticizers, and stability modifiers, can be added, if necessary, in the same manner as described in the case of the above negative-working photosensitive composition (2).

The added amount of these various additives varies depending on the purpose, but is preferably, in general, in the range of from 0 to 30% by weight based on the solid content of the photosensitive composition.

As described above, since the photosensitive composition according to the present invention comprises a phenol resin having a urea bond in the main chain, a coating film exhibiting superior solvent resistance can be obtained. In addition, since the coating film is hardly corroded by the solvent, such a coating film also exhibits superior wear resistance.

Photosensitive Planographic Printing Plate

The photosensitive planographic printing plate of the present invention, sometimes referred to as a photosensitive planographic printing plate precursor, is generally composed of a substrate, and a photosensitive layer formed from the above photosensitive composition provided on the substrate.

The photosensitive layer formed from the photosensitive composition for an infrared laser may be referred to as a heat-sensitive layer because it utilizes heat generated by irradiation with light, but is here referred to as a photosensitive layer for convenience.

Examples of the substrate include metal plates made of aluminum, zinc, copper, stainless steel, and iron; plastic films made of polyethylene terephthalate, polycarbonate, polyvinyl acetal, and polyethylene; composite materials obtained by providing a metal layer on a paper or a plastic film melt-coated with a synthetic resin or coated with a synthetic resin solution using a technology such as vacuum deposition or lamination; and materials used as the substrate of the printing plate. Among these substrates, an aluminum substrate and a composite substrate coated with aluminum are preferable.

The surface of the aluminum substrate is preferably subjected to a surface treatment for the purpose of enhancing water retention and improving the adhesion with the photosensitive layer. Examples of the surface treatment include, for example, brushing, ball polishing, electrolytic etching, chemical etching, liquid horning, a roughening treatment such as sand blasting, and combinations thereof. Among these, a roughening treatment including electrolytic etching is preferable.

In the electrolytic bath used during the electrolytic etching, an aqueous solution containing an acid, an alkali, or a salt thereof, or an aqueous solution containing an organic solvent is used. Among these, an electrolytic solution containing hydrochloric acid, nitric acid, or a salt thereof is, in particular, preferable.

Furthermore, if necessary, the aluminum substrate subjected to the roughening treatment is subjected to a desmutting treatment using an aqueous solution of an acid or alkali. The aluminum substrate thus obtained is preferably anodized. In particular, an anodizing treatment performed in a bath containing sulfuric acid or phosphoric acid is preferable.

In addition, if necessary, the aluminum substrate can be subjected to a silicate treatment (sodium silicate, potassium silicate), a treatment with potassium zirconate fluoride, a phosphomolybdate treatment, an alkyl titanate treatment, a polyacrylate treatment, a polyvinyl sulfonate treatment, a phosphonate treatment, a phytate treatment, a treatment with a salt of a hydrophilic organic polymer compound and a divalent metal, a hydrophilization treatment by means of undercoating of a water-soluble polymer having a sulfonic acid group, a coloring treatment with an acidic dye, and a treatment such as silicate deposition.

It is preferable that the aluminum substrate be subjected to a sealing treatment after a roughening treatment (graining treatment) and an anodizing treatment. The sealing treatment is performed by dipping the aluminum substrate in a hot water or a hot aqueous solution containing an inorganic salt or an organic salt, or by employing a steam bath.

The photosensitive planographic printing plate of the present invention is produced by applying a photosensitive coating solution prepared by dissolving or dispersing a photosensitive composition in an organic solvent on the surface of a substrate, and drying the coating solution to form a photosensitive layer on the substrate.

As the organic solvent in which the photosensitive composition is dissolved or dispersed, any publicly known and conventional organic solvents can be used. Among these, an organic solvent having a boiling point in the range of from 40 to 200° C., and particularly from 60 to 160° C., is selected in view of advantages during drying.

Examples of organic solvents include alcohols such as methyl alcohol, ethyl alcohol, n- or isopropyl alcohol, n- or isobutyl alcohol, and diacetone alcohol; ketones such as acetone, methyl ethyl ketone, methyl propyl ketone, methyl butyl ketone, methyl amyl ketone, methyl hexyl ketone, diethyl ketone, diisobutyl ketone, cyclohexanone, methylcyclohexanone, and acetylacetone; hydrocarbons such as hexane, cyclohexane, heptane, octane, nonane, decane, benzene, toluene, xylene, and methoxybenzene; acetic esters such as ethyl acetate, n- or isopropyl acetate, n- or isobutyl acetate, ethylbutyl acetate, and hexyl acetate; halides such as methylene dichloride, ethylene dichloride, and monochlorobenzene; ethers such as isopropyl ether, n-butyl ether, dioxane, dimethyidioxane, and tetrahydrofuran; polyhydric alcohols and derivatives thereof, such as ethylene glycol, METHYL CELLOSOLVE®, METHYL CELLOSOLVE® acetate, ETHYL CELLOSOLVE®, DIETHYL CELLOSOLVE®, CELLOSOLVE® acetate, BUTYL CELLOSOLVE®, BUTYL CELLOSOLVE® acetate, methoxymethoxy ethanol, diethylene glycol monomethyl ether, diethylene glycol dimethyl ether, diethylene glycol methylethyl ether, diethylene glycol diethyl ether, propylene glycol, propylene glycol monomethyl ether, propylene glycol monomethyl ether acetate, propylene glycol monoethyl ether, propylene glycol monoethyl ether acetate, propylene glycol monobutyl ether, 3-methyl-3-methoxybutanol, and 1-methoxy-2-propanol; and special solvents such as dimethyl sulfoxide, N,N-dimethylformamide, N,N-dimethylacetamide, methyl lactate, and ethyl lactate. These organic solvents are used alone or in combination thereof. The concentration of the solid content in the photosensitive coating solution is suitably controlled in the range of from 2 to 50% by weight.

In the photosensitive coating solution, additives to improve the coatability may be added. Examples of the additive to improve the coatability include cellulose alkyl ethers, ethylene oxide surfactants, fluorine surfactants, and silicone surfactants.

Specific examples of the fluorine surfactants include anionic fluorine surfactants such as a perfluoroalkyl group-containing carboxylate, a perfluoroalkyl group-containing sulfonate, a perfluoroalkyl group-containing sulfuric ester, and a perfluoroalkyl group-containing phosphate; cationic fluorine surfactants such as a perfluoroalkyl group-containing amine salt and a perfluoroalkyl group-containing quaternary ammonium salt; amphoteric fluorine surfactants such as a perfluoroalkyl group-containing carboxybetaine and a perfluoroalkyl group-containing aminocarboxylate; and perfluoroalkyl group-containing oligomers, perfluoroalkyl group-containing polymers, and perfluoroalkyl group-containing sulfonamide polyethylene glycol adducts.

As the method of coating the coating solution, methods such as roll coating, dip coating, air knife coating, gravure coating, gravure offset coating, hopper coating, blade coating, wire doctor coating, and spray coating can be used. The coating amount of the coating solution is preferably in the range of from 10 ml/m$^2$ to 100 ml/m$^2$.

The photosensitive composition applied on the substrate is usually dried by means of heated air. The heating is performed at a temperature preferably ranging from 30 to 200° C., and particularly preferably ranging from 40 to 140° C. Not only a method of maintaining the drying temperature at the same temperature during drying, but also a method of raising the temperature stepwise can be carried out.

In addition, preferable results may be obtained by dehumidification of the drying air. The heated air is supplied to the surface to be coated at a rate preferably ranging from 0.1 m/seconds to 30 m/seconds, and particularly preferably ranging from 0.5 m/seconds to 20 m/seconds.

The coating weight of the photosensitive composition is usually about 0.5 to about 5 g/m$^2$ on a dry weight basis.

Method for Manufacturing a
Planographic Printing Plate

The photosensitive planographic printing plate having a photosensitive layer formed from each of the photosensitive compositions (1) to (3) is converted into a planographic printing plate having a corresponding image formed on the substrate by exposing the photosensitive layer to light in a state of close contact with a silver salt mask film and developing with a developer, thereby to dissolve and remove the non-image portion. Examples of the preferable light sources include carbon arc lamps, mercury lamps, metal halide lamps, xenon lamps, chemical lamps, and lasers.

The photosensitive planographic printing plate having a photosensitive layer formed from each of the photosensitive compositions (3) to (5) described above can be used as a so-called computer-to-plate (CTP), which can directly write an image on a plate based on digital information from the computer using a laser. Examples of the light source of the laser used in the present invention include lasers that emit light in the ultraviolet, visible, or infrared range having a wavelength in the range of from 300 nm to 3000 nm. Specific examples thereof include Ar ion lasers (488 nm, 515 nm), FD-YAG lasers (532 nm), He—Ne lasers (633 nm, 543 nm, 364 nm), InGaN semiconductor lasers (360 to 450 nm, particularly 405 nm), various semiconductor lasers wherein the oscillation wavelength is in the range of from 760 nm to 950 nm, and YAG lasers (oscillation wavelength: 1064 nm). Any laser can be used by selecting the pigments or dye, which can absorb light having a specific wavelength of the light source to convert light into heat, or sensitizing pigments among those described above, and adding them to the photosensitive composition.

The photosensitive planographic printing plate having a sensitive layer formed from each of the photosensitive compositions (3) to (5) described above is converted into a planographic printing plate having an image portion by writing an image on a photosensitive layer using a laser, subsequently carrying out a developing treatment thereon, and removing the non-image portion using a wet method. An example of the developer used in the developing treatment includes an aqueous alkali solution (basic aqueous solution). Examples of the alkali agent used in the developer include inorganic alkali compounds such as sodium silicate, potassium silicate, potassium hydroxide, sodium hydroxide, lithium hydroxide, a sodium, potassium, or ammonium salt of secondary or tertiary phosphoric acid, sodium metasilicate, sodium carbonate, and ammonia; and organic alkali compounds such as monomethylamine, dimethylamine, trimethylamine, monoethylamine, diethylamine, triethylamine, monoisopropylamine, diisopropylamine, n-butylamine, di-n-butylamine, monoethanolamine, diethanolamine, triethanolamine, ethyleneimine, and ethylenediamine.

The content of the alkali agent in the developer is preferably in the range of from 0.005 to 30% by weight, and particularly preferably in the range of from 0.05 to 15% by weight. If the content of the alkali agent in the developer is less than 0.005% by weight, the development tends to be poor. On the other hand, if the amount is more than 30% by weight, an adverse effect such as corrosion of the image portion tends to be exerted during the development. Therefore, they are not preferred.

An organic solvent can be added to the developer. Examples of the organic solvent that can be added to the developer include ethyl acetate, butyl acetate, amyl acetate, benzyl acetate, ethylene glycol monobutyl acetate, butyl lactate, butyl levulinate, methyl ethyl ketone, ethyl butyl ketone, methyl isobutyl ketone, cyclohexanone, ethylene glycol monobutyl ether, ethylene glycol monobenzyl ether, ethylene glycol monophenyl ether, benzyl alcohol, methyl phenyl carbitol, n-amyl alcohol, methylamyl alcohol, xylene, methylene dichloride, ethylene dichloride, and monochlorobenzene.

The amount of the organic solvent to be added to the developer is preferably not more than 20% by weight, and, in particular, preferably not more than 10% by weight.

Furthermore, in the developers described above, for example, if necessary, water-soluble sulfites such as lithium sulfite, sodium sulfite, potassium sulfite, and magnesium sulfite; aromatic hydroxy compounds such as an alkali-soluble pyrazolone compound, an alkali-soluble thiol compound, and methylresorcinol; water softeners such as a polyphosphate and an aminopolycarboxylate; and various surfactants such as anionic surfactants, nonionic surfactants, cationic surfactants, amphoteric surfactants, and fluorine surfactants such as sodium isopropylnaphthalene sulfonate, sodium n-butylnaphthalene sulfonate, sodium N-methyl-N-pentadecyl aminoacetate, and sodium lauryl sulfate, and various defoarmers can be used.

As the developer, commercially available developers for positive-working PS plates or negative-working PS plates can be practically used. Specifically, a developer prepared by diluting a commercially available concentrated developer for positive-working PS plates or negative-working PS plates, 1 to 200 times, can be used as the developer in the present invention.

The temperature of the developer is preferably in the range of from 15 to 40° C., while the dipping time is preferably in the range of from 1 second to 5 minutes. If necessary, it is possible to slightly rub the surface during development.

After completion of the development, the planographic printing plate is subjected to washing with water and/or is subjected to a treatment with an aqueous desensitizer (finishing gum). The aqueous desensitizer includes, for example, an aqueous solution of a water-soluble natural polymer such as gum arabic, dextrin, or carboxymethylcellulose, or an aqueous solution of a water-soluble synthetic polymer such as polyvinyl alcohol, polyvinyl pyrrolidone, or polyacrylic acid. If necessary, an acid or a surfactants is added to the aqueous desensitizer. After subjecting to the treatment with the desensitizer, the planographic printing plate is dried, and is subsequently used as a printing plate for printing.

In order to improve durability of the produced planographic printing plate, the planographic printing plate can be subjected to a baking treatment. The baking treatment can be performed by the steps of (i) first, washing the planographic printing plate produced by the treatment method descried above to remove the rinsing solution or the gum solution, followed by using a squeegee; (ii) subsequently extending a baking solution in a uniform manner on the entire plate, followed by drying; (iii) baking the plate for one minute to 30 minutes at the temperature ranging from 180° C. to 300° C. by means of an oven, and (iv) removing the baking solution by washing the plate with water after the plate is cooled, followed by gum application and drying.

The baking solution is specifically used as a treatment aqueous solution used before the baking treatment in order to prevent smudging after the baking treatment. As the main components thereof, various surfactants, and in particular, preferably an anionic surfactant and/or a fluorine surfactant, in the amount of 0.005 to 30% by weight; and various acids, alkalis, or salts in order to maintain pH in the range of from 2 to 11 and preferably in the range of from 3 to 10 are added. Examples of anionic surfactants include sulfonic group-containing active agents such as an alkylbenzene sulfonate, an alkyldiphenyl ether disulfonate, an alkylnaphthalene sulfonate, an aldehyde condensate of an alkylnaphthalene sulfonic acid, an α-olefin sulfonate, and an alkyl sulfonate; sulfate active agents such as a lauryl sulfate, a polyoxyethylene alkyl ether sulfate, and a polyoxyethylene alkyl phenyl ether sulfate; and the like. In addition, examples of fluorine surfactants include anionic fluorine surfactants such as a perfluoroalkyl group-containing carboxylate, a perfluoroalkyl group-containing sulfonate, a perfluoroalkyl group-containing sulfate, and a perfluoroalkyl group-containing phosphate; cationic fluorine surfactants such as a perfluoroalkyl group-containing amine salt and a perfluoroalkyl group-containing quaternary ammonium salt; amphoteric fluorine surfactants such as a perfluoroalkyl group-containing carboxybetaine and a perfluoroalkyl group-containing aminocarboxylate; nonionic fluorine surfactants such as a perfluoroalkyl group-containing oligomer, a perfluoroalkyl group-containing polymer, and a perfluoroalkyl group-containing sulfonamide polyethylene glycol adduct;

and the like. In addition, examples of acids include inorganic acids such as nitric acid, sulfuric acid, and phosphoric acid; citric acid, succinic acid, oxalic acid, tartaric acid, acetic acid, malic acid, phytic acid, an organophosphonic acid, p-toluenesulfonic acid, xylenesulfonic acid, and the like. In addition, with the acids described above, a potassium salt, a lithium salt, a sodium salt, an ammonium salt, or a hydroxide, a carbonate, or a hydrogencarbonate of an alkali metal may be used.

Furthermore, in the baking solution, a polymer compound which is a natural product or a modified compound of the natural product or a synthetic polymer, and has film-formability can be also added in the amount ranging from 0.0001% by weight to 3% by weight with respect to the total weight. In addition, preservatives, defoaming agents, coloring agents, and the like may be added thereto.

In the photosensitive planographic printing plate described above, since the photosensitive composition forming the photosensitive layer contains a phenol resin having a urea bond in the main chain, superior solvent resistance, particularly resistance to a UV ink-washing oil used during UV ink printing, and superior durability can be exhibited. In addition, a baking applicability is also good.

The photosensitive composition of the present invention can be used for various purposes, such as a photoresist, in addition to the planographic printing plate.

EXAMPLES

The present invention will be described in more detail by way of Examples. It should be understood that the present invention is not limited to the following Examples.

Phenol Resins Having a Urea Bond in the Main Chain

Synthesis Example 1

In a 200 ml flask equipped with a stirrer and a heater, 30 g of methanol and 5 g of N,N-dimethylacetamide were charged. Subsequently, 13.87 g (0.126 mol) of catechol and 13.76 g (0.115 mol) of N,N'-dimethylolurea were added thereto. While the reaction mixture was being stirred at room temperature, 6 g (12 N) of concentrated hydrochloric acid was added thereto, followed by heating the mixture. When the temperature of the reaction mixture reached 55° C., the temperature was maintained, and the mixture was reacted for 5 hours at 55 to 60° C.

The viscosity of the reaction solution after the completion of the reaction was C as Gardner viscosity. The reaction solution was poured into 400 ml of water, while stirring, thus precipitating a pale yellow solid material. It was recovered by filtration, and was subsequently dried, thus producing 20 g of a resin. The yield thereof was 72%.

Synthesis Example 2

In the same manner as described in Synthesis Example 1, except that 15.64 g (0.126 mol) of 3-methylcatechol was used instead of 13.87 g (0.126 mol) of catechol, 25 g of a resin was produced. The yield thereof was 85%.

Synthesis Example 3

In the same manner as described in Synthesis Example 1, except that 15.64 g (0.126 mol) of 4-methylcatechol was used instead of 13.87 g (0.126 mol) of catechol, 23 g of a resin was produced. The yield thereof was 78%.

Synthesis Example 4

In the same manner as described in Synthesis Example 1, except that 17.66 g (0.126 mol) of 4-methoxycatechol was used instead of 13.87 g (0.126 mol) of catechol, 22 g of a resin was produced. The yield thereof was 75%.

Synthesis Example 5

In a 500 ml flask equipped with a stirrer and a heater, 150 g of methanol and 15 g of water were charged. Subsequently, 63.05 g (0.50 mol) of pyrogallol and 50.0 g (0.45 mol) of N,N'-dimethylolurea were added thereto. The mixture was stirred to dissolve them. After 7.0 g (12 N) of concentrated hydrochloric acid was added thereto, the reaction mixture was heated. When the temperature of the reaction mixture reached 55° C., the temperature was maintained, and the mixture was reacted for 7 hours at 55 to 60° C.

The reaction solution after the completion of the reaction was poured into 1000 ml of water, while stirring. The precipitated solid material was recovered by filtration, and was subsequently dried, thus producing 89 g of a resin. The yield thereof was 79%.

Synthesis Example 6

In 200 ml flask equipped with a stirrer, a drying tube with silica gel, and a heater, 100 ml of dried N,N-dimethylacetamide was charged. Subsequently, 5.0 g of a resin synthesized in Synthesis Example 1 was added thereto, and the mixture was stirred at room temperature to dissolve them. Subsequently, 5.0 g of phenyl isocyanate (1.7 mole equivalent with respect to two hydroxyl groups of catechol) was added thereto, and three drops of di-n-butyl tin dilaurate and three drops of triethylamine were further added thereto. The mixture was reacted for 2 hours at 50° C.

The reaction solution after the completion of the reaction was poured into 1000 ml of water, while stirring. The precipitated solid material was recovered by filtration, and was subsequently dried, thus producing 8.0 g of a resin. The yield thereof was 80%.

Synthesis Example 7

In 200 ml flask equipped with a stirrer and a drying tube with silica gel, 100 ml of dried N,N-dimethylacetamide was charged. Subsequently, 5.0 g of a resin synthesized in Synthesis Example 1 was added thereto, and the mixture was stirred at room temperature to dissolve it. Subsequently, 2.5 g of p-toluenesulfonyl chloride (1.0 mole equivalent with respect to two hydroxyl groups of catechol) was added thereto, and 2.0 g of triethylamine was further added thereto. The mixture was reacted overnight at room temperature.

The reaction solution after the completion of the reaction was poured into 1000 ml of water, while stirring, and was acidified by adding several drops of a 65% aqueous solution of sulfuric acid. The solid material precipitated from the reaction solution was recovered by filtration, and was subsequently dried, thus producing 6.0 g of a resin. The yield thereof was 80%.

Synthesis Example 8

In the same manner as described in Synthesis Example 7, except that the added amount of p-toluenesulfonyl chloride was 4.0 g (1.6 mole equivalent with respect to two hydroxyl groups of catechol) and the added amount of triethylamine was 3.0 g, 7.0 g of a resin was produced. The yield thereof was 78%.

Synthesis Example 9

In a 200 ml flask equipped with a stirrer and a drying tube with silica gel, 100 ml of dried N,N-dimethylacetamide was charged. Subsequently, 3.0 g of a resin synthesized in Synthesis Example 5 was added thereto, and the mixture was stirred at room temperature to dissolve it. Subsequently, 6.0 g of p-toluenesulfonyl chloride (2.2 mole equivalent with respect to three hydroxyl groups of pyrogallol) was added thereto, and 4.6 g of triethylamine was further added thereto. The mixture was reacted overnight at room temperature.

The reaction solution after the completion of the reaction was poured into 1000 ml of water, while stirring, and was acidified by adding several drops of a 65% aqueous solution of sulfuric acid. The solid material precipitated from the reaction solution was recovered by filtration, and was subsequently dried, thus producing 7.0 g of a resin. The yield thereof was 87%.

Synthesis Example 10

In the same manner as described in Synthesis Example 9, except that the added amount of p-toluenesulfonyl chloride was 8.2 g (3.0 mole equivalent with respect to three hydroxyl groups of pyrogallol) and the added amount of triethylamine was 6.8 g, 7.2 g of a resin was produced. The yield thereof was 75%.

Synthesis Example 11

In a 200 ml flask equipped with a stirrer and a drying tube with silica gel, 150 ml of dried N,N-dimethylacetamide was charged. Subsequently, 12.2 g of a resin synthesized in Synthesis Example 5 was added thereto, and the mixture was stirred at room temperature to dissolve it. Subsequently, 5.0 g of 3-nitrobenzyl chloride (1.5 mole equivalent with respect to three hydroxyl groups of pyrogallol) was added thereto, and 3.5 g of triethylamine was further added thereto. The mixture was reacted overnight at room temperature.

The reaction solution after the completion of the reaction was poured into 1000 ml of water, while stirring, and was acidified by adding several drops of a 65% aqueous solution of sulfuric acid. The solid material precipitated from the reaction solution was recovered by filtration, and was subsequently dried, thus producing 12.0 g of a resin. The yield thereof was 73%.

Synthesis Example 12

In a 200 ml flask equipped with a stirrer and a drying tube with silica gel, 150 ml of dried N,N-dimethylacetamide was charged. Subsequently, 5.0 g of a resin synthesized in Synthesis Example 5 was added thereto, and the mixture was stirred at room temperature to dissolve it. Subsequently, 1.85 g of p-toluoyl chloride (1.5 mole equivalent with respect to three hydroxyl groups of pyrogallol) was added thereto, and 1.5 g of triethylamine was further added thereto. The mixture was reacted overnight at room temperature.

The reaction solution after the completion of the reaction was poured into 1000 ml of water, while stirring, and was acidified by adding several drops of a 65% aqueous solution of sulfuric acid. The solid material precipitated from the reaction solution was recovered by filtration, and was subsequently dried, thus producing 4.3 g of a resin. The yield thereof was 55%.

Novolac Resin for Comparative Example

Synthesis Example 13

In a 500 ml flask equipped with a stirrer, a heater, and a condenser, 100 g of m-cresol, 66.8 g of p-cresol, 36.0 g of phenol, 105.0 g of a 37% aqueous solution of formaldehyde, and 2.5 g of oxalic acid were charged while stirring. Subsequently, the mixture was heated and was stirred for 3 hours at 105° C. Subsequently, the mixture was heated to 175° C. to remove water, and the residual monomer was removed at 200° C./100 mmHg. The novolac resin synthesized by the method described above had a weight-average molecular weight of 4000.

Manufacture of Substrate 1

An aluminum sheet having a thickness of 0.24 mm was degreased with an aqueous solution of sodium hydroxide, and was then electrolytically grained in a 20% hydrochloric acid bath to obtain a grained sheet having a center line average roughness (Ra) of 0.5 µm.

The grained sheet was anodized in a 20% sulfuric acid bath at a current density of 2 A/dm$^2$ to form an oxidized film of 2.7 g/m$^2$. The film was subjected to a sealing treatment with an aqueous solution of sodium. silicate, and was subsequently washed with water, followed by drying, thus producing a hydrophilic aluminum substrate (Substrate 1).

Manufacture of Substrate 2

In the same manner as described in the manufacturing method of Substrate 1, except that the sealing treatment with an aqueous solution of sodium silicate was not carried out, a hydrophilic aluminum substrate (Substrate 2) was produced.

Example 1

A photosensitive coating solution having the composition shown in Table 1 for use in a negative-working PS plate was applied on the Substrate 1 using a bar coater, rod number #12, and was subsequently dried for 3 minutes at 100° C., thus producing a negative-working photosensitive planographic printing plate. The coating weight after drying was 2.0±0.2 g/m$^2$.

TABLE 1

| Composition of photosensitive coating solution | Amount (g) |
|---|---|
| Phenol resin produced in Synthesis Example 9 | 50 |
| Hexafluorophosphate of a condensate of p-diazophenylamine and formaldehyde | 5 |
| Dipentaerythritol hexaacrylate | 15 |
| 2-(4-methoxynaphthyl)-4,6-bis(trichloromethyl)-s-triazine | 2.5 |
| Victoria Pure Blue BOH | 1 |
| METHYL CELLOSOLVE ® | 500 |
| Methyl ethyl ketone | 200 |
| N,N-dimethylacetamide | 100 |
| Methanol | 200 |

Comparative Example 1

In the same manner as described in Example 1, except that 50.0 g of the novolac resin produced in Synthesis Example 13 was used instead of the phenol resin produced in Synthesis Example 9 in the photosensitive coating solution, a negative-working photosensitive planographic printing plate was produced. The coating weight after drying was 2.0±0.2 g/m$^2$.

The negative-working planographic printing plates produced in Example 1 and Comparative Example 1 were exposed to light under the condition of 35 units by an exposing machine ("P-824-GX", DAINIPPON SCREEN MFG. CO., LTD.), using a 3 kW metal halide lamp from a distance of 1 m.

Subsequently, the exposed planographic printing plates were developed for 20 seconds at 30° C. in a processor ("PD-912M," DAINIPPON SCREEN MFG. CO., LTD.), using a developer prepared by diluting one part by volume of a developer "ND-1" with 2 parts by volume of water, thus producing printing plates.

To observe the washing oil resistance with respect to a washing oil for use in UV ink of the negative-working planographic printing plate, the printing plates produced as described above were dipped in a washing oil A ("Daicure washing oil A," DAINIPPON INK & CHEMICALS Co., Ltd.) and was dipped in a roller washing oil ("Daicure roller washing oil," DAINIPPON INK & CHEMICALS Co., Ltd.), for 30 minutes at room temperature to observe the presence or absence of corrosion.

In addition, the durability was evaluated from the final number of impressions obtained with accurate printing, after the printing plate was affixed to a printing press ("R-700," MAN Roland), and subsequently printing was performed using UV ink ("Daicure Scepter Black," DAINIPPON INK & CHEMICALS Co., Ltd.), and a fountain solution (a diluted solution prepared by diluting "NA-108W" (DAINIPPON INK & CHEMICALS Co., Ltd.) with water 100 times). The printing test was performed by stopping the printing press every 5000 impressions, and subsequently washing the roller with the washing oil A. The results of the sensitivity, washing oil resistance, and durability of the printing plates are shown in Table 2.

TABLE 2

| | | | Washing oil resistance | | |
|---|---|---|---|---|---|
| | | Sensitivity | Washing | Roller | Durability |
| | Resin | Step Microline | oil A | washing oil | (impressions) |
| Example 1 | Synthesis Example 9 | 10/3  14 | ○ | ○ | 100,000 |
| Comparative Example 1 | Synthesis Example 13 | 10/3  14 | X | X | 5,000 |

In the table, "step" means the clear/solid step number. "Microline" means the width between the microlines reproduced on the printing plate, and the minimum line width ($\mu$m) was read. In addition, the evaluation criteria of washing oil resistance are described in the following.

O: good usability

X: corrosion is observed and it cannot be used.

As is apparent from the results shown in Table 2, the printing plate produced in Example 1 could completely print 100,000 impressions, and on the other hand, in the printing plate produced in Comparative Example 1 could not print due to corrosion after washing with the washing oil A the first time.

Example 2

A photosensitive coating solution having the composition shown in Table 3 for use in a positive-working PS plate was applied on the Substrate 2 using a bar coater, rod number #12, and was subsequently dried for 3 minutes at 100° C. to produce a positive-working photosensitive planographic printing plate. The coating weight after drying was 2.0±0.2 g/m².

TABLE 3

| Composition of photosensitive coating solution | Amount (g) |
|---|---|
| Phenol resin produced in Synthesis Example 1 | 0.75 |
| Esterified product of 1,2-naphthoquinone diazide-5-sulfonyl chloride and 2,3,4-trihydroxybenzophenone | 0.2 |
| 2-(4-methoxynaphthyl)-4,6-bis(trichloromethyl)-s-triazine | 0.01 |
| Victoria Pure Blue BOH | 0.01 |
| N,N-dimethylacetamide | 1 |
| METHYL CELLOSOLVE ® | 9 |

Example 3

In the same manner as described in Example 2, except that 0.75 g of the phenol resin produced in Synthesis Example 6 was used instead of the phenol resin produced in Synthesis Example 1, a positive-working photosensitive planographic printing plate was produced. The coating weight after drying was 2.0±0.2 g/m².

Example 4

In the same manner as described in Example 2, except that 0.75 g of the phenol resin produced in Synthesis Example 8 was used instead of the phenol resin produced in Synthesis Example 1, a positive-working photosensitive planographic printing plate was produced. The coating weight after drying was 2.0±0.2 g/m².

Comparative Example 2

In the same manner as described in Example 2, except that 0.75 g of the novolac resin produced in Synthesis Example 13 was used instead of the phenol resin produced in Synthesis Example 1 in the photosensitive coating solution, a positive-working photosensitive planographic printing plate was produced. The coating weight after drying was 2.0±0.2 g/m².

The positive-working planographic printing plates produced in Examples 2 to 4 and Comparative Example 2 were exposed to light under the condition of 29 units by means of an exposing machine ("P-824-GX," DAINIPPON SCREEN MFG. CO., LTD.), using a 3 kW metal halide lamp from a distance of 1 m.

Subsequently, developers having various dilution rates with "PD-1" (Kodak Polychrome Graphics Co., Ltd.) were prepared, and the exposed planographic printing plates developed for 20 seconds at 30° C. by means of manual development, using the developers, thus producing a printing plate.

The washing oil resistance of the positive-working planographic printing plate was evaluated in the same manner as described in the evaluation of the washing oil resistance of the negative-working planographic printing plates.

In addition, the durability was evaluated from the final number of impressions obtained with accurate printing, after the printing plate was affixed to a printing press ("R-700," MAN Roland), and subsequently printing was performed using UV ink ("Daicure Scepter Black," DAINIPPON INK & CHEMICALS Co., Ltd.), and a fountain solution (a diluted solution prepared by diluting "NA-108W" (DAINIPPON INK & CHEMICALS Co., Ltd.) with water 100 times). The printing test was performed by stopping the printing press every 5000 impressions, and subsequently washing the roller with the washing oil A. The results of the sensitivity, washing oil resistance, and durability of the printing plates are shown in Table 4.

TABLE 4

| | Resin | Dilution of developer | Sensitivity | | Washing oil resistance | | Durability (impressions) |
| --- | --- | --- | --- | --- | --- | --- | --- |
| | | | Step | Micro-line | Washing oil A | Roller washing oil | |
| Example 2 | Synthesis Example 1 | 1/100 | 4.5/11 | 12 | O | O | 50,000 |
| Example 3 | Synthesis Example 6 | 1/30 | 4.5/11 | 13 | O | O | 50,000 |
| Example 4 | Synthesis Example 7 | 1/15 | 4.5/11 | 14 | O | O | 50,000 |
| Comparative Example 2 | Synthesis Example 13 | 1/8 | 4.5/11 | 12 | X | X | 3,000 |

In the table, "step" means the clear/solid step number. For example, "1/8" of the "dilution of developer" in the table means that one part by volume of the original developer is diluted with 8 parts by volume of water. Other cases mean the dilution of developer in the same manner as described above. In addition, the evaluation criteria of washing oil resistance are described in the following.

O: Good usability
X: Corrosion is observed and it cannot be used.

As is apparent from the results shown in Table 4, the printing plates produced in Examples 2 to 4 had good photosensitivity, and at the same time, had resistance with respect to washing oil, and provided good results even in the printing test using UV ink.

On the other hand, the printing plate produced in Comparative Example 2 exhibited insufficient washing oil resistance and insufficient durability.

The planographic printing plates produced in Examples 2 to 4 and Comparative Example 2 were washed with water, and a baking solution (UT1, Kodak Polychrome Graphics Co., Ltd.) was applied on the printing plate. Subsequently, the printing plates were subjected to a baking treatment for 5 minutes at 240° C. in a baking oven (SPBO-1 type, KOYO CHEMICALS INC.). The planographic printing plates obtained after the baking treatment were washed with water, and a gum was applied on the printing plate. Each of the obtained planographic printing plates was affixed to a printing press (SPRINT 26, KOMORI Corporation), and printing was performed using ink (GEOS-G magenta N, DAINIPPON INK & CHEMICALS Co., Ltd.), a fountain solution (a solution prepared by diluting "NA-108W" (DAINIPPON INK & CHEMICALS Co., Ltd.) with water 50 times), and paper (Royal Coat, Oji Paper Co., Ltd.). The durability was evaluated, and the presence or absence of quality deterioration due to baking was observed. The results are shown in Table 5.

TABLE 5

| | Durability (impressions) | Quality deterioration due to baking |
| --- | --- | --- |
| Example 2 | 100,000 | absent |
| Example 3 | 100,000 | absent |
| Example 4 | 100,000 | absent |
| Comparative Example 2 | 5,000 | present |

As is apparent from the results shown in Table 5, the planographic printing plates of the present invention (Examples 2 to 4) which had been subjected to a baking treatment exhibited improved durability without occurrences of quality deterioration due to baking. On the other hand, in the planographic printing plate of Comparative Example 2), although durability was improved, quality deterioration due to baking was observed, and therefore it was not suitable for practical use.

Example 5

In a 100 ml flask 30 g of METHYL CELLOSOLVE® and 2.0 g of the phenol resin produced in Synthesis Example 10 were charged, followed by stirring for one hour at room temperature to completely dissolve them.

Subsequently, to the solution, 4.0 g of a resol resin ("GP resin", Georgia Pacific Corp.), 0.28 g of diazo MSPF6 (Kodak Chemical Company), 0.28 g of Infrared Dye A (Kodak Chemical Company), and 0.1 g of a dye wherein the counter anion of Victoria Pure Blue BOH (Hodogaya Chemical Co., Ltd.) is replaced by a 1-naphthalenesulfonic acid anion were added, followed by stirring for 30 minutes at room temperature. Subsequently, 5 drops of a surfactant ("DC190", Dow Corning) were added thereto, followed by stirring for 30 minutes at room temperature. The mixed solution was filtered through a filter having an opening size of 10 μm, thus producing a photosensitive coating solution.

The photosensitive coating solution was applied on the Substrate 2 using a bar coater, rod number #12, and was then dried for 40 seconds at 110° C. to produce a negative-working photosensitive planographic printing plate. The coating weight after drying was 2.0±0.2 g/m².

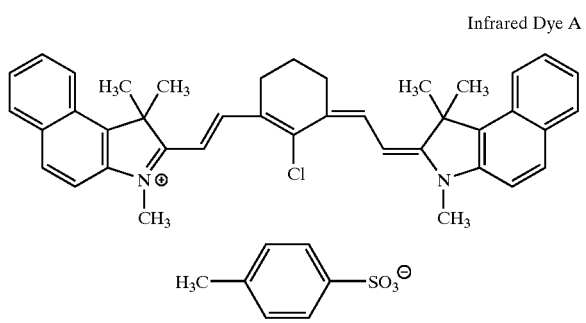

Infrared Dye A

Comparative Example 3

In the same manner as described in Example 5, except that 2.0 g of the novolac resin produced in Synthesis Example 1 3 was used instead of the phenol resin produced in Synthesis Example 10 in the photosensitive coating solution, a negative-working planographic printing plate was produced. The coating weight was 2.0±0.2 g/m².

Using a Creo setter 3244 (wavelength: 830 nm, laser power: 8.5 W, revolution speed: 150 rpm) (Creo) comprising a near infrared semiconductor laser mounted therein, solid image writing on the negative-working planographic printing plate produced in Example 5 was performed. Subsequently, using a preheating oven ("SPC MINI-HD-48/122", Kodak Polychrome Graphics Co., Ltd.), the planographic printing plate was subjected to a heat treatment for 100 seconds at about 129° C. (264° F.). Subsequently, the planographic printing plate was subjected to a treatment with a developer prepared by diluting ND-1 developer (Kodak Polychrome Graphics Co., Ltd.) with water 2 times, for 30 seconds at 30° C., thus producing a printing plate.

On the other hand, in the same manner as described in the negative-working planographic printing plate produced in Example 5, using a Creo setter 3244 (wavelength: 830 nm, laser power: 8.5 W, revolution speed: 150 rpm) (Creo) comprising a near infrared semiconductor laser mounted therein, solid image writing on the negative-working planographic printing plate produced in Comparative Example 3 was performed. Subsequently, using a preheating oven ("SPC MINI-HD-48/122", Kodak Polychrome Graphics Co., Ltd.), the planographic printing plate was subjected to a heat treatment for 100 seconds at about 129° C.(264° F.).

Subsequently, the planographic printing plate was subjected to a treatment with a developer prepared by diluting PD-1 developer (Kodak Polychrome Graphics Co., Ltd.) with water 5 times, for 20 seconds at 30° C., thus producing a printing plate.

Each of the printing plates produced as described above was dipped in a solution prepared by adding 10% isopropyl alcohol to a diluted solution of the fountain solution ("NA-108W", DAINIPPON INK & CHEMICALS Co., Ltd.) for use in printing, 100 times, and was dipped in a 50% aqueous solution of isopropyl alcohol, for 30 minutes at room temperature. The solvent resistance with respect to the fountain solution and the solvent was evaluated. The results are shown in Table 6.

In addition, the negative-working planographic printing plates produced in Example 5 and Comparative Example 3 were subjected to image-writing, and were subjected to the heat treatment, as described above. Subsequently, the planographic printing plates were subjected to a developing treatment in the conditions as described above respectively, followed by a gum application, thus producing printing plates for use in printing. Each of the printing plates was affixed to a printing press ("R-700", MAN Roland), and printing was performed using ink ("GEOS-G magenta N", DAINIPPON INK & CHEMICALS Co., Ltd.) and using a fountain solution prepared by diluting the fountain solution ("NA-108W", DAINIPPON INK & CHEMICALS Co., Ltd.) with water 100 times and adding 10% isopropyl alcohol thereto. The durability of each of the printing plates was evaluated from the final number of impressions obtained with accurate printing. The results are shown in Table 6.

TABLE 6

| | | | | Solvent resistance | |
| --- | --- | --- | --- | --- | --- |
| | Resin | Image performance Dot quality (%) | Durability (impressions) | Fountain solution (10% IPA) | 50% IPA |
| Example 5 | Synthesis Example 9 | 1–99 | 250,000 | ○ | ○ |
| Comparative Example 3 | Synthesis Example 13 | 1–99 | 150,000 | Δ | X |

In the table, "dot quality (1–99)" means that the dot quality is good without problems within the entire range of from 1 % to 99%. In addition, the evaluation criteria for fountain solution resistance are described in the following.
○: No change on the printing plate material is observed, and the printing plate is good.
Δ: The printing plate material is slightly corroded, but there are no problems on use.
X: The printing plate material is corroded by the solvent, and the printing plate cannot be used.

As is apparent from the results shown in Table 6, the negative-working planographic printing plate produced in Example 5 exhibited good image performance and exhibited superior resistance with respect to the fountain solution, superior resistance with respect to isopropyl alcohol used as a solvent, and superior durability during printing, as compared to the negative-working planographic printing plate produced in Comparative Example 3.

Example 6

In a flask with a volume of 100 ml, 30 g of METHYL CELLOSOLVE® and 2.0 g of the phenol resin produced in Synthesis Example 1 were charged, followed by stirring for one hour at room temperature to completely dissolve them.

Subsequently, infrared pigment trump dye (Kodak Chemical Company), and two drops of a surfactant ("DC190", Dow Corning Corporation) were added thereto, followed by stirring at room temperature for 30 minutes. The mixed solution was filtered through a filter having an opening size of 10 μm to produce a photosensitive coating solution.

The photosensitive coating solution was applied on the Substrate 2 using a bar coater, rod number #14, and was then dried for 40 seconds at 120° C. to produce a positive-working photosensitive planographic-printing plate. The coating weight after drying was 2.0±0.2 g/m².

Example 7

In the same manner as described in Example 6, except that 2.0 g of the phenol resin produced in Synthesis Example 2 was used instead of the phenol resin produced in Synthesis Example 1 in the photosensitive coating solution, a positive-working planographic printing plate was produced. The coating weight was 2.0±0.2 g/m².

Example 8

In the same manner as described in Example 6, except that 2.0 g of the phenol resin produced in Synthesis Example 3 was used instead of the phenol resin produced in Synthesis Example 1 in the photosensitive coating solution, a positive-working planographic printing plate was produced. The coating weight was 2.0±0.2 g/m².

Example 9

In the same manner as described in Example 6, except that 2.0 g of the phenol resin produced in Synthesis Example 4 was used instead of the phenol resin produced in Synthesis Example 1 in the photosensitive coating solution, a positive-working planographic printing plate was produced. The coating weight was 2.0±0.2 g/m².

Example 10

In the same manner as described in Example 6, except that 2.0 g of the phenol resin produced in Synthesis Example 6 was used instead of the phenol resin produced in Synthesis Example 1 in the photosensitive coating solution, a positive-working planographic printing plate was produced. The coating weight was 2.0±0.2 g/m².

Example 11

In the same manner as described in Example 6, except that 2.0 g of the phenol resin produced in Synthesis Example 7 was used instead of the phenol resin produced in Synthesis Example 1 in the photosensitive coating solution, a positive-working planographic printing plate was produced. The coating weight was 2.0±0.2 g/m².

Example 12

In the same manner as described in Example 6, except that 2.0 g of the phenol resin produced in Synthesis Example 8 was used instead of the phenol resin produced in Synthesis Example 1 in the photosensitive coating solution, a positive-working planographic printing plate was produced. The coating weight was 2.0±0.2 g/m².

Example 13

In the same manner as described in Example 6, except that 2.0 g of the phenol resin produced in Synthesis Example 13 was used instead of the phenol resin produced in Synthesis Example 1 in the photosensitive coating solution, a positive-working planographic printing plate was produced. The coating weight was 2.0±0.2 g/m².

Example 14

In the same manner as described in Example 6, except that 2.0 g of the phenol resin produced in Synthesis Example 12 was used instead of the phenol resin produced in Synthesis Example 1 in the photosensitive coating solution, a positive-working planographic printing plate was produced. The coating weight was 2.0±0.2 g/m².

Comparative Example 4

In the same manner as described in Example 6, except that 2.0 g of the novolac resin produced in Synthesis Example 13 was used instead of the phenol resin produced in Synthesis Example 1 in the photosensitive coating solution, a positive-working planographic printing plate was produced. The coating weight was 2.0±0.2 g/m².

Each of the positive-working planographic printing plates produced in Examples 6 to 14 and Comparative Example 4 was dipped in a washing oil A ("Daicure washing oil A" DAINIPPON INK & CHEMICALS Co., Ltd.), and was dipped in a roller washing oil ("Daicure roller washing oil" DAINIPPON INK & CHEMICALS Co., Ltd.), for 30 minutes at room temperature, thereby evaluating washing oil resistance thereof. The results thereof are shown in Table 7.

In addition, using a Creo setter 3244 (wavelength: 830 nm, laser power: 8.5 W, revolution speed: 150 rpm) (Creo) comprising a near infrared semiconductor laser mounted therein, image writing on each of the positive-working planographic printing plates produced in Examples 6 to 14 and Comparative Example 4 was performed. The visual feasibility of the image (print-out property) obtained therein was evaluated by visual observation. The results are shown in Table 7.

In addition, using a developer PD1 (Kodak Polychrome Graphics Co., Ltd.), a proper point in order to obtain a positive image by manual development was obtained. The results are shown in Table 8.

TABLE 7

| | | Image performance Dot quality (%) | Durability (impressions) | Washing oil resistance | | Print out property |
|---|---|---|---|---|---|---|
| | Resin | | | Washing oil A | Roller washing oil | |
| Example 6 | Synthesis Example 1 | 1–99 | 50,000 | ○ | ○ | ○ |
| Example 7 | Synthesis Example 2 | 1–99 | 50,000 | ○ | ○ | ○ |

TABLE 7-continued

|  | Resin | Image performance Dot quality (%) | Durability (impressions) | Washing oil resistance Washing oil A | Washing oil resistance Roller washing oil | Print out property |
|---|---|---|---|---|---|---|
| Example 8 | Synthesis Example 3 | 1–99 | 50,000 | ○ | ○ | ○ |
| Example 9 | Synthesis Example 4 | 1–99 | 50,000 | ○ | ○ | ○ |
| Example 10 | Synthesis Example 6 | 1–99 | 50,000 | ○ | ○ | ○ |
| Example 11 | Synthesis Example 7 | 1–99 | 50,000 | ○ | ○ | ○ |
| Example 12 | Synthesis Example 8 | 1–99 | 50,000 | ○ | ○ | Δ |
| Example 13 | Synthesis Example 11 | 1–99 | 50,000 | ○ | ○ | Δ |
| Example 14 | Synthesis Example 12 | 1–99 | 50,000 | ○ | ○ | Δ |
| Comparative Example 4 | Synthesis Example 13 | 1–99 | 3,000 | X | X | X |

In the table, "dot quality (1–99)" means that the dot quality is observed as being good within the entire range of from 1 to 99%. In addition, the evaluation criteria of washing oil resistance are described in the following.
O: No change on the printing plate material is observed, and the printing plate is good.
X: The printing plate material is corroded by the solvent, and the printing plate cannot be used.

In addition, "print out" (exposure visual image quality) indicates visual feasibility of the image part, and the evaluation criteria thereof are descried in the following.
O: Visibility is good.
Δ: The image part is visible although it is weak.
X: The image part is hardly visible.

TABLE 8

|  | Proper developing point | | |
|---|---|---|---|
|  | Dilution of developer | Temperature (° C.) | Time (seconds) |
| Example 6 | 1/100 | 30 | 25 |
| Example 7 | 1/100 | 30 | 25 |
| Example 8 | 1/100 | 30 | 25 |
| Example 9 | 1/100 | 30 | 25 |
| Example 10 | 1/30 | 30 | 20 |
| Example 11 | 1/100 | 30 | 25 |
| Example 12 | 1/15 | 30 | 30 |
| Example 13 | 1/10 | 30 | 20 |
| Example 14 | 1/10 | 30 | 20 |
| Comparative Example 4 | 1/8 | 30 | 30 |

In the table, "1/8" of the dilution of developer PD1 in the table means that one part by volume of the original developer is diluted with 8 parts by volume of water. Other cases mean the dilution of developer in the same manner as described above.

With respect to the dot quality in the image performance, each of the positive-working planographic printing plates produced in Examples 6 to 14 and Comparative Example 4 exhibited good dot quality.

However, as is apparent from the results shown in Table 7, the positive-working planographic printing plate produced in Comparative Example 4 did not exhibit washing resistance at all. On the other hand, the positive-working planographic printing plates produced in Examples 6 to 14 exhibited good washing oil resistance without corrosion due to the solvent.

In addition, with respect to durability and print out property (exposure visual image quality), the positive-working planographic printing plates produced in Examples 6 to 14 exhibited good results, as is apparent from the results shown in Table 7.

The planographic printing plates produced in Examples 6 to 14 and Comparative Example 4 were washed with water, and a baking solution (UT1, Kodak Polychrome Graphics Co., Ltd.) was applied on the printing plates. Subsequently, the printing plates were baked for 5 minutes at 240° C. in a baking oven (SPBO-1 type, KOYO CHEMICALS INC.). The resulting planographic printing plates were washed with water, and a gum was applied on the printing plate. Each of the resulting planographic printing plates was affixed to a printing press (SPRINT 26, KOMORI Corporation), and printing was performed using ink (GEOS-G magenta N, DAINIPPON INK & CHEMICALS Co., Ltd.), a fountain solution (a diluted solution prepared by diluting "NA-108W" (DAINIPPON INK & CHEMICALS Co., Ltd.) with water 50 times), and paper (Royal Coat, Oji Paper Co., Ltd.). The durability was evaluated, and the presence or absence of quality deterioration due to baking was observed. The results are shown in Table 9.

TABLE 9

|  | Durability (impressions) | Quality deterioration due to baking | Washing oil resistance Washing oil A | Washing oil resistance Roller washing oil |
|---|---|---|---|---|
| Example 6 | 100,000 | absence | ○ | ○ |
| Example 7 | 100,000 | absence | ○ | ○ |
| Example 8 | 100,000 | absence | ○ | ○ |
| Example 9 | 100,000 | absence | ○ | ○ |
| Example 10 | 100,000 | absence | ○ | ○ |
| Example 11 | 100,000 | absence | ○ | ○ |
| Example 12 | 100,000 | absence | ○ | ○ |
| Example 13 | 100,000 | absence | ○ | ○ |
| Example 14 | 100,000 | absence | ○ | ○ |
| Comparative Example 4 | 5,000 | presence | Δ | Δ |

As is apparent from the results shown in Table 9, the planographic printing plates of the present invention (Examples 6 to 14) which had been subjected to a baking treatment exhibited improved durability without occurrences of quality deterioration due to baking. On the other hand, in the planographic printing plate of Comparative Example 4, although durability and washing resistance were slightly improved, quality deterioration due to baking was observed, and therefore, it was not suitable for practical use.

According to the photosensitive compositions of the present invention, a phenol resin containing a urea bond in the main chain is included therein, and for this reason, a coating film exhibiting superior wear resistance and superior solvent resistance to the solvents included in various printing chemicals can be obtained.

In addition, according to the photosensitive planographic printing plates of the present invention, a photosensitive layer formed from the photosensitive composition described above is provided on the surface of a substrate, and for this reason, good durability, good exposure visual image property, and good solvent resistance, particularly superior resistance to washing oil used in UV ink printing are exhibited. In addition, they exhibit superior baking property. Furthermore, the method for manufacturing a planographic printing plate of the present invention can provide a planographic printing plate which exhibits good durability, good exposure visual image property, and good solvent resistance, particularly superior resistance to washing oil used in UV ink printing, and exhibits superior baking property.

What is claimed is:

1. A photosensitive composition comprising a phenol resin having a urea bond in the main chain;

in which the photosensitive composition is selected from the group consisting of:

positive-working photosensitive compositions comprising the phenol resin and a quinone diazide compound;

negative-working photosensitive compositions comprising the phenol resin and a photosensitive diazonium compound;

negative-working photosensitive compositions comprising the phenol resin, an ethylenically unsaturated compound, and a radical polymerization initiator;

positive-working photosensitive compositions comprising the phenol resin and a photothermal conversion material; and negative-working photosensitive compositions comprising the phenol resin, an acid generating agent, an acid crosslinking agent, and the photothermal conversion material.

2. The photosensitive composition of claim 1 in which the phenol resin is produced by condensation polymerization between dimethylolurea and a monomer selected from the group consisting of phenols, bisphenols, hydroxynaphthalenes, and condensates of p-cresol/formaldehyde having a low molecular weight.

3. The photosensitive composition of claim 1 in which the phenolic hydroxyl groups of the phenol resin are partially substituted by ether groups, ester groups, urethane groups, or carbonate groups.

4. The photosensitive composition of claim 1 in which the phenol resin comprises a structural unit represented by:

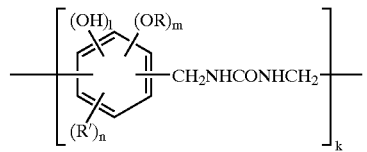

wherein I=1, 2, 3, or 4; m=0, 1, 2, or 3; n=0, 1, 2, or 3; I+m+n=1, 2, 3, or 4; k is an integer; R is ether residue, an ester residue, a urethane residue, or a carbonate residue; and R' is a substituted or unsubstituted monovalent organic group having not more than 20 carbon atoms.

5. A photosensitive planographic printing plate precursor comprising a substrate and a photosensitive layer on the surface of the substrate;

in which:

the photosensitive layer comprises a photosensitive composition;

the photosensitive composition comprises a phenol resin having a urea bond in the main chain; and the photosensitive composition is selected from the group consisting of:

positive-working photosensitive compositions comprising the phenol resin and a quinone diazide compound;

negative-working photosensitive compositions comprising the phenol resin and a photosensitive diazonium compound;

negative-working photosensitive compositions comprising the phenol resin, an ethylenically unsaturated compound, and a radical polymerization initiator;

positive-working photosensitive compositions comprising the phenol resin and a photothermal conversion material; and negative-working photosensitive compositions comprising the phenol resin, an acid generating agent, an acid crosslinking agent, and the photothermal conversion material.

6. The photosensitive planographic printing plate precursor of claim 5 in which the phenol resin is produced by condensation polymerization between dimethylolurea and a monomer selected from the group consisting of phenols, bisphenols, hydroxynaphthalenes, and condensates of p-cresol/formaldehyde having a low molecular weight.

7. The photosensitive planographic printing plate precursor of claim 5 in which the phenolic hydroxyl groups of the phenol resin are partially substituted by ether groups, ester groups, urethane groups, or carbonate groups.

8. The photosensitive planographic printing plate precursor of claim 5 in which the phenol resin comprises a structural unit represented by:

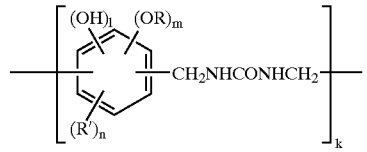

wherein I=1, 2, 3, or 4; m=0, 1, 2, or 3; n=0, 1, 2, or 3; I+m+n=1, 2, 3, or 4; k is an integer; R is ether residue, an ester residue, a urethane residue, or a carbonate residue; and R' is a substituted or unsubstituted monovalent organic group having not more than 20 carbon atoms.

9. The photosensitive planographic printing plate precursor of any one of claims 5 to 8 in which the photosensitive composition is the positive-working photosensitive compositions comprising the phenol resin and the quinone diazide compound.

10. The photosensitive planographic printing plate precursor of any one of claims 5 to 8 in which the photosensitive composition is the negative-working photosensitive compositions comprising the phenol resin and the photosensitive diazonium compound.

11. The photosensitive planographic printing plate precursor of any one of claims 5 to 8 in which the photosensitive composition is the negative-working photosensitive compositions comprising the phenol resin, the ethylenically unsaturated compound, and the radical polymerization initiator.

12. The photosensitive planographic printing plate precursor of any one of claims 5 to 8 in which the photosensitive composition is the positive-working photosensitive compositions comprising the phenol resin and the photothermal conversion material.

13. The photosensitive planographic printing plate precursor of any one of claims 5 to 8 in which the photosensitive composition is the negative-working photosensitive compositions comprising the phenol resin, the acid generating agent, the acid crosslinking agent, and the photothermal conversion material.

14. A method for manufacturing a planographic printing plate, the method comprising the steps of:

imaging a photosensitive layer of a photosensitive planographic printing plate precursor and forming an imaged precursor; and developing the imaged precursor in an aqueous alkaline solution and forming the planographic printing plate;

in which:

the photosensitive layer comprises a photosensitive composition;

the photosensitive composition comprises a phenol resin having a urea bond in the main chain; and the photosensitive composition is selected from the group consisting of:

positive-working photosensitive compositions comprising the phenol resin and a quinone diazide compound;

negative-working photosensitive compositions comprising the phenol resin and a photosensitive diazonium compound;

negative-working photosensitive compositions comprising the phenol resin, an ethylenically unsaturated compound, and a radical polymerization initiator;

positive-working photosensitive compositions comprising the phenol resin and a photothermal conversion material; and negative-working photosensitive compositions comprising the phenol resin, an acid generating agent, an acid crosslinking agent, and the photothermal conversion material.

15. The method of claim 14 additionally comprising the step of baking the planographic printing plate.

* * * * *